United States Patent [19]

Dolby

[11] Patent Number: 4,922,535
[45] Date of Patent: May 1, 1990

[54] TRANSIENT CONTROL ASPECTS OF CIRCUIT ARRANGEMENTS FOR ALTERING THE DYNAMIC RANGE OF AUDIO SIGNALS

[76] Inventor: Ray M. Dolby, 3340 Jackson St., San Francisco, Calif. 94118

[21] Appl. No.: 835,243

[22] Filed: Mar. 3, 1986

[51] Int. Cl.$^5$ .......................... H04B 1/66; H03G 7/00
[52] U.S. Cl. ..................................... 381/29; 381/106; 333/14
[58] Field of Search .............. 333/14; 381/106, 29–32; 455/72

[56] References Cited

U.S. PATENT DOCUMENTS

| Re. 28,426 | 5/1975 | Dolby | 333/14 |
|---|---|---|---|
| 3,846,719 | 11/1974 | Dolby | 333/14 |
| 3,903,485 | 9/1975 | Dolby | 333/14 |
| 4,072,914 | 2/1978 | Haramoto et al. | 381/106 |
| 4,319,205 | 3/1982 | Scholz | 333/14 |
| 4,490,691 | 12/1984 | Dolby | 333/14 |
| 4,498,055 | 2/1985 | Dolby | 333/14 |

OTHER PUBLICATIONS

Dolby, "An Audio Noise Reduction System", Journal of the Audio Engineering Society, Oct. 1967.
Dolby, "The Spectral Recording Process", J. Audio Eng. Soc., vol. 35, No. 3, 3/87, pp. 99–118.
Roberts, John, "$70 Decoder for New CX Records", Popular Electronics, Jan. 1982, pp. 39–44.
JVC, "Noise Reduction/Dynamic Range Expansion System" used in JVC VHD video disc system (believed to be disclosed at least as early as Feb. 1981), pp. 1–6.
Dolby A-type circuit description, published in the early 1970's.
Hardcastle, Ian, "Dolby Noise Reduction in Automotive Applications", technical paper presented at SAE International Congress & Exposition, Detroit, Mich., Feb. 27–Mar. 2, 1984.
Berkovitz, Robert and Gundry, Kenneth, "Dolby B-Type Noise Reduction System-Part 2", reprinted from Audio, Oct. 1973.
Dolby, Ray, "A 20 db Audio Noise Reduction System for Consumer Applications", reprinted from J. Audio Eng. Soc., vol. 31, No. 3, Mar. 1983, pp. 98–113.

Primary Examiner—Gary V. Harkcom
Assistant Examiner—John Merecki
Attorney, Agent, or Firm—Thomas A. Gallagher

[57] ABSTRACT

In circuits for generating rapidly changing, yet smooth and controlled, control signals in response to transient signals for use in audio compressors and expanders, a steady-state portion of the control circuit includes first and second smoothing stages (alternatively, a single stage may be employed) and an overshoot suppression portion of the control circuit rapidly charges the capacitor in the steady-state smoothing stage from which the control voltage is derived. A first additional overshoot suppression circuit provides further charging of the capacitor in response to low frequency signal components. Modulation control signals, which make the compressor or expander less susceptible to control by stopband signal components, are combined in opposition to the signals in the steady-state and overshoot suppression portions of the control circuit. A further overshoot suppression circuit provides additional charging of the capacitor in order to compensate in certain cases for the use of modulation control signals.

72 Claims, 12 Drawing Sheets

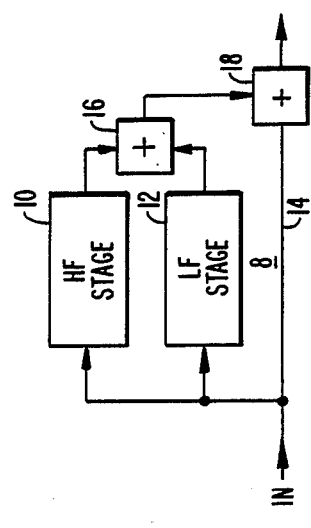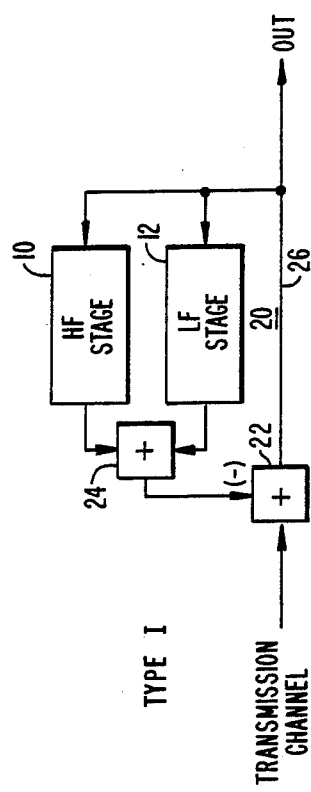
TYPE I
FIG._1.
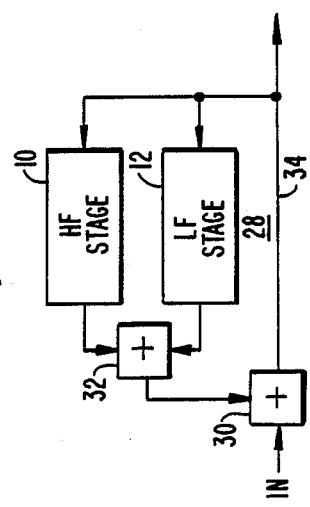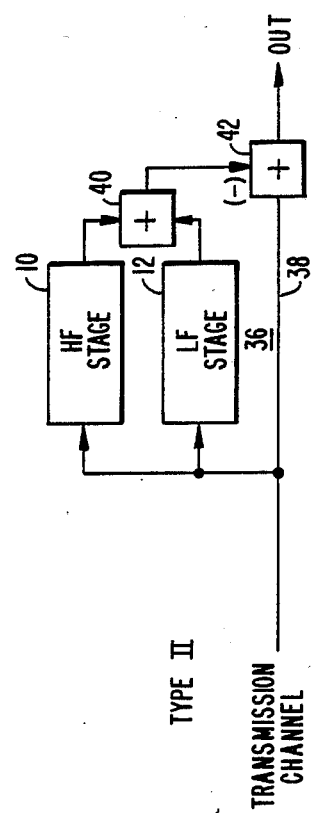
TYPE II
FIG._2.

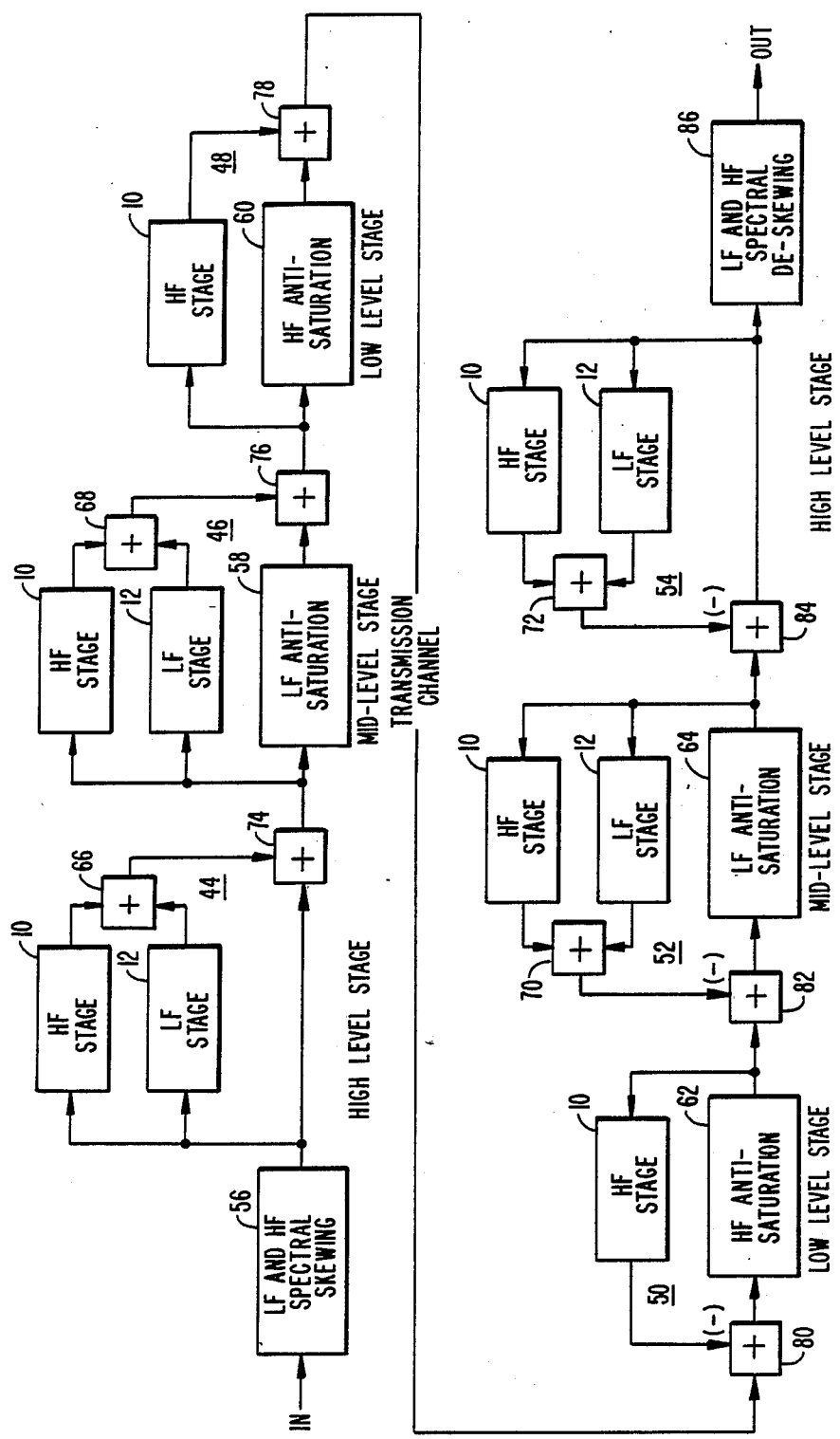
FIG._3.

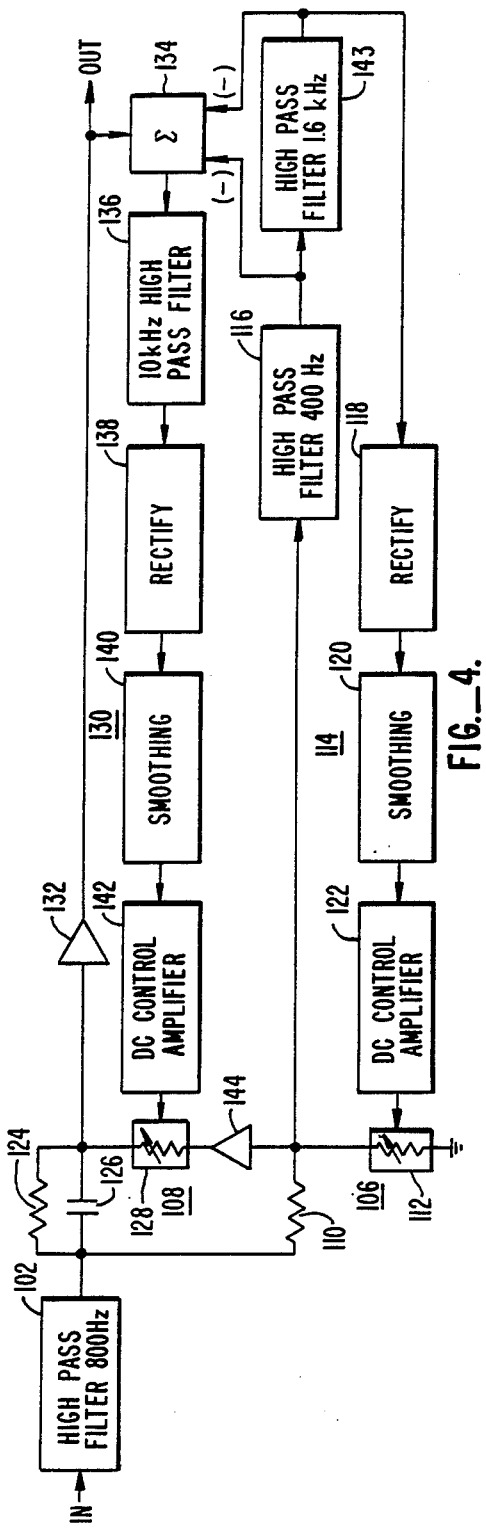
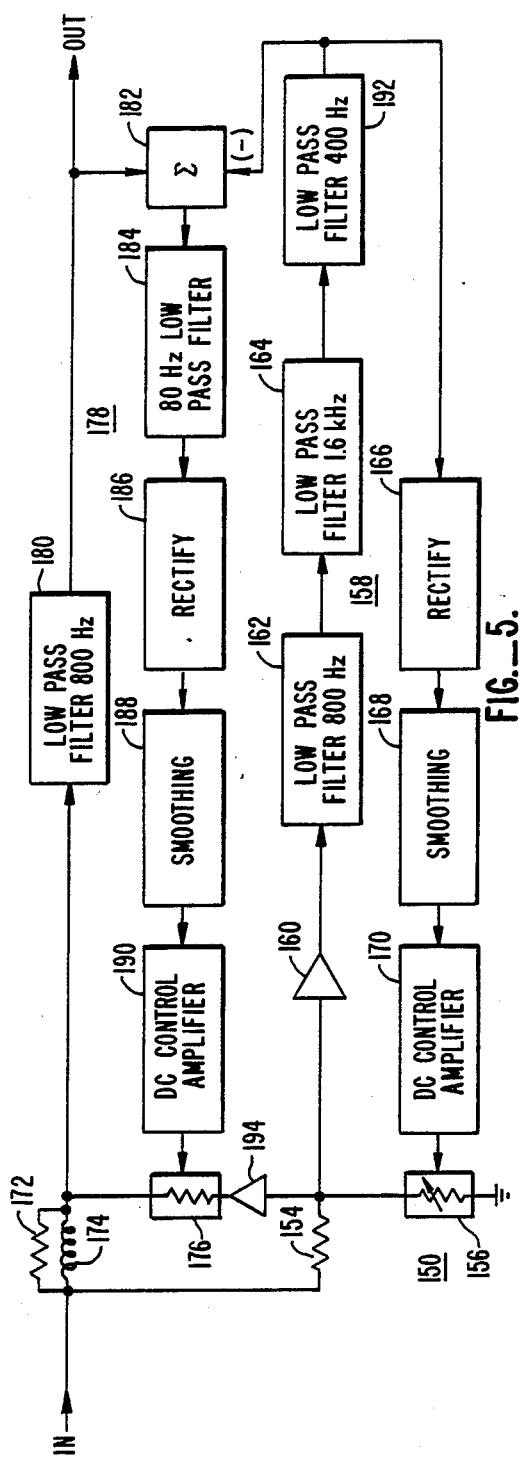
FIG.—4.
FIG.—5.

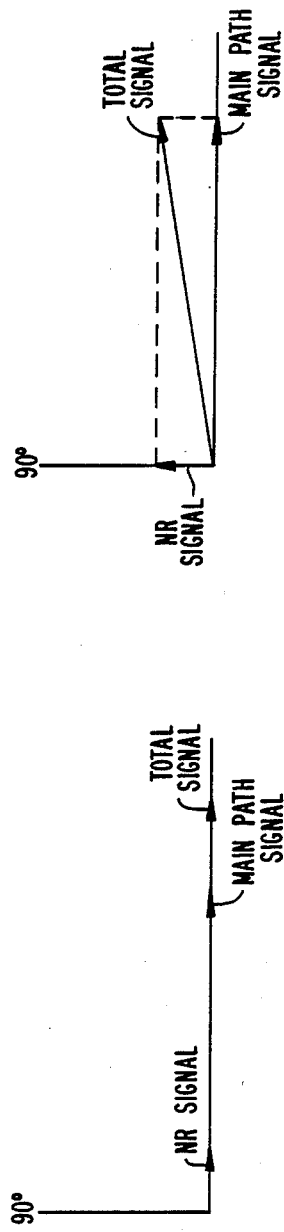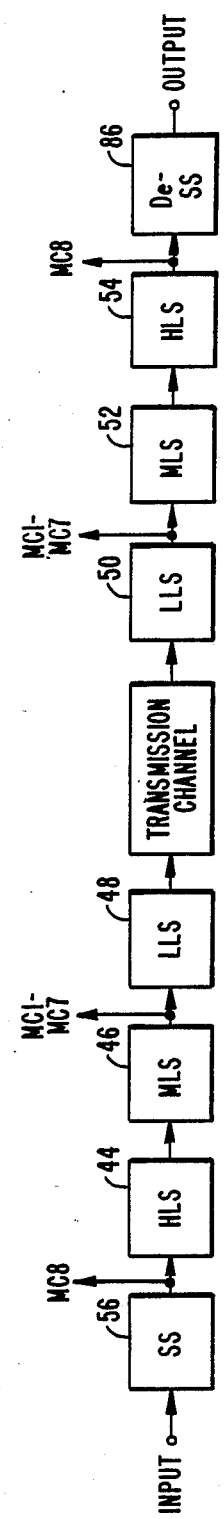

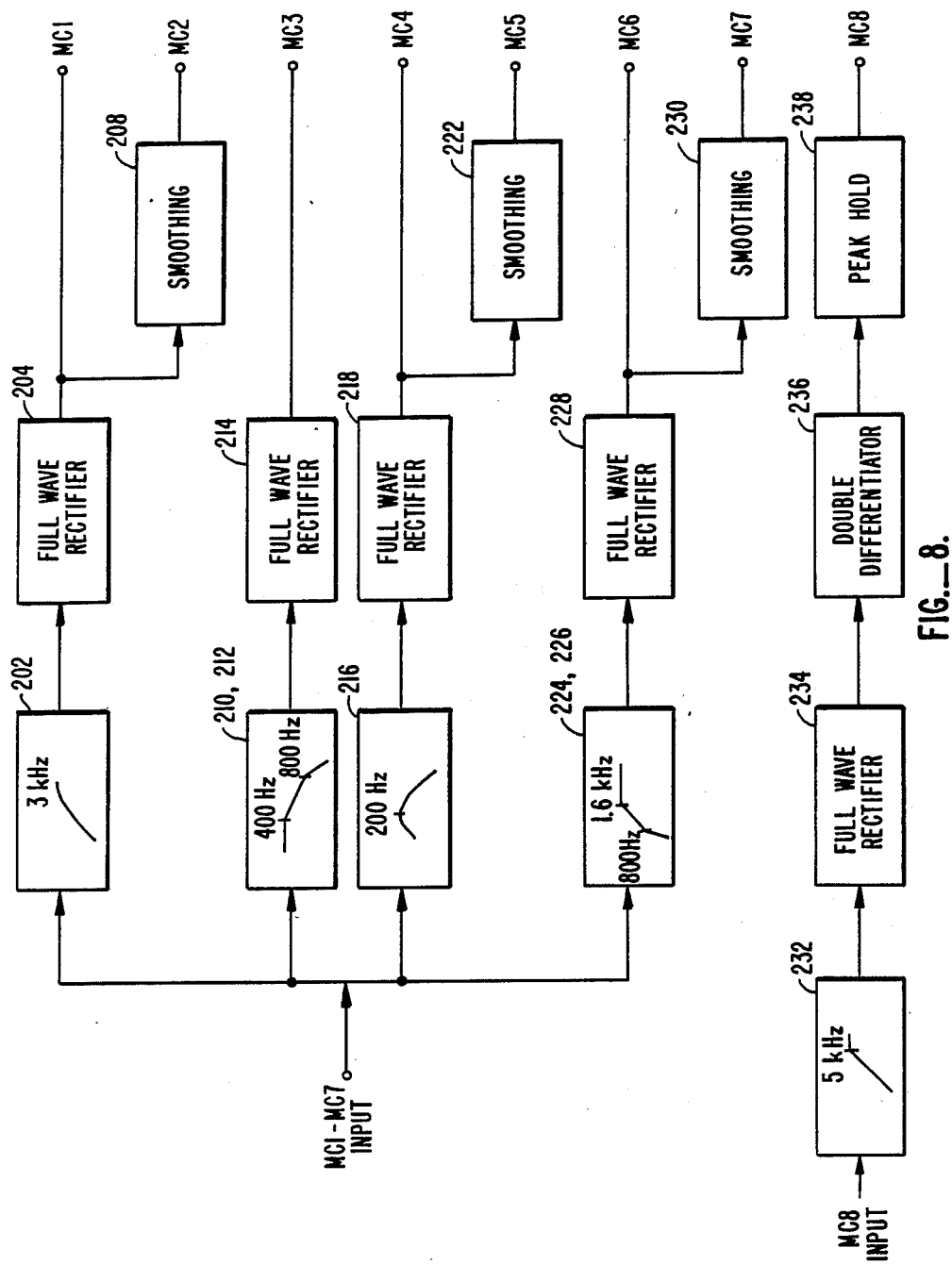
FIG._8.

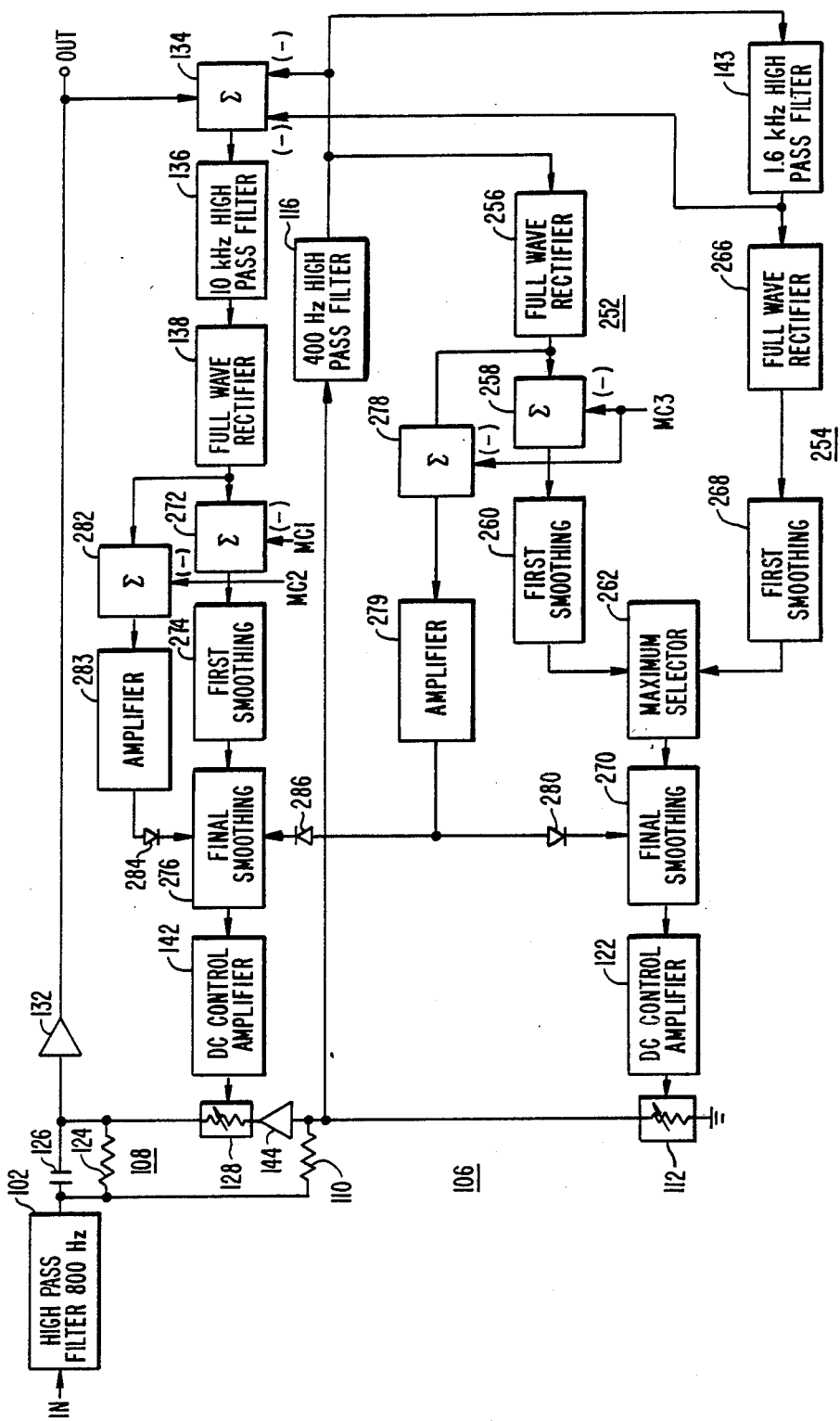
FIG._9.

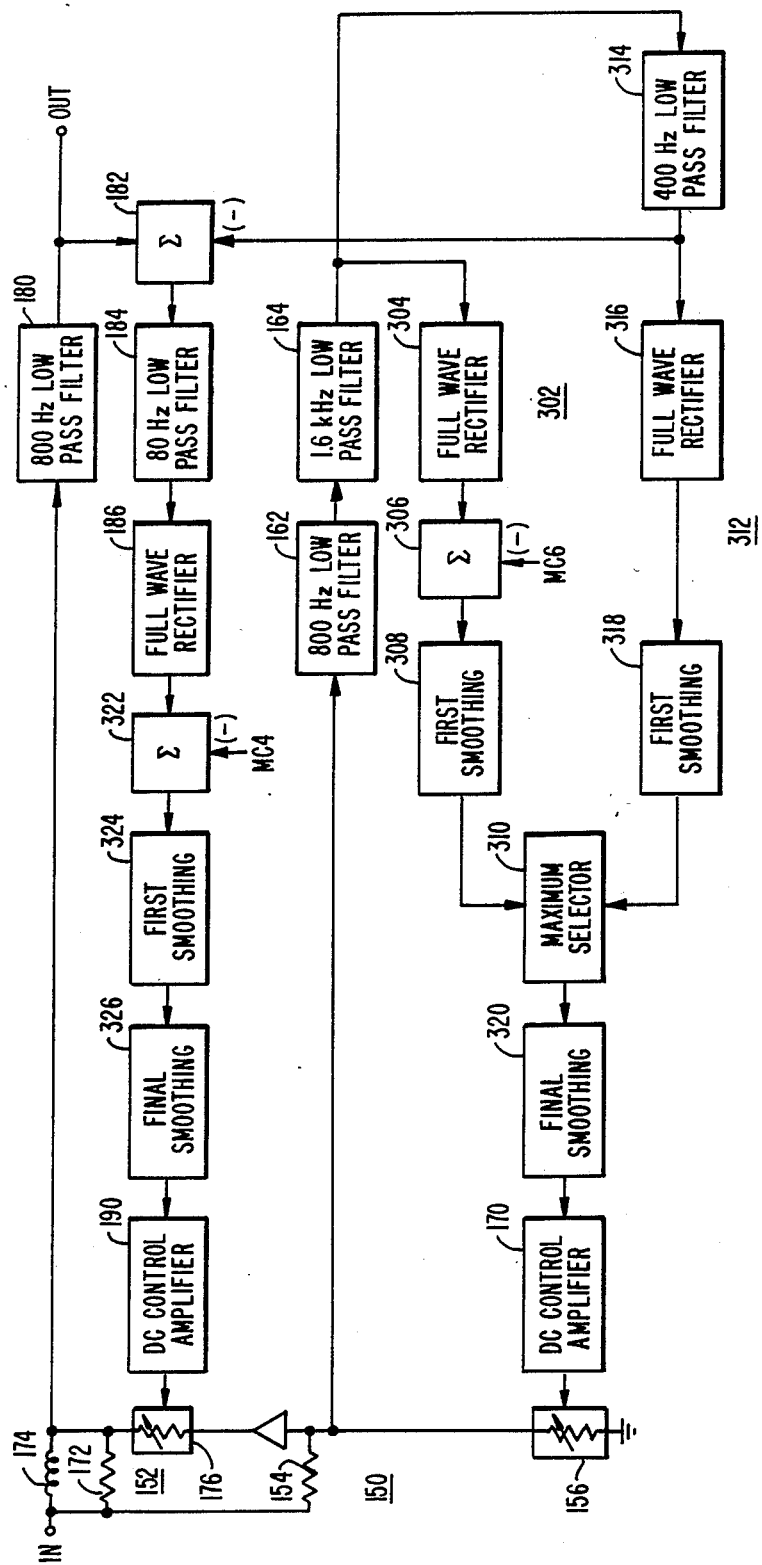
FIG._10.

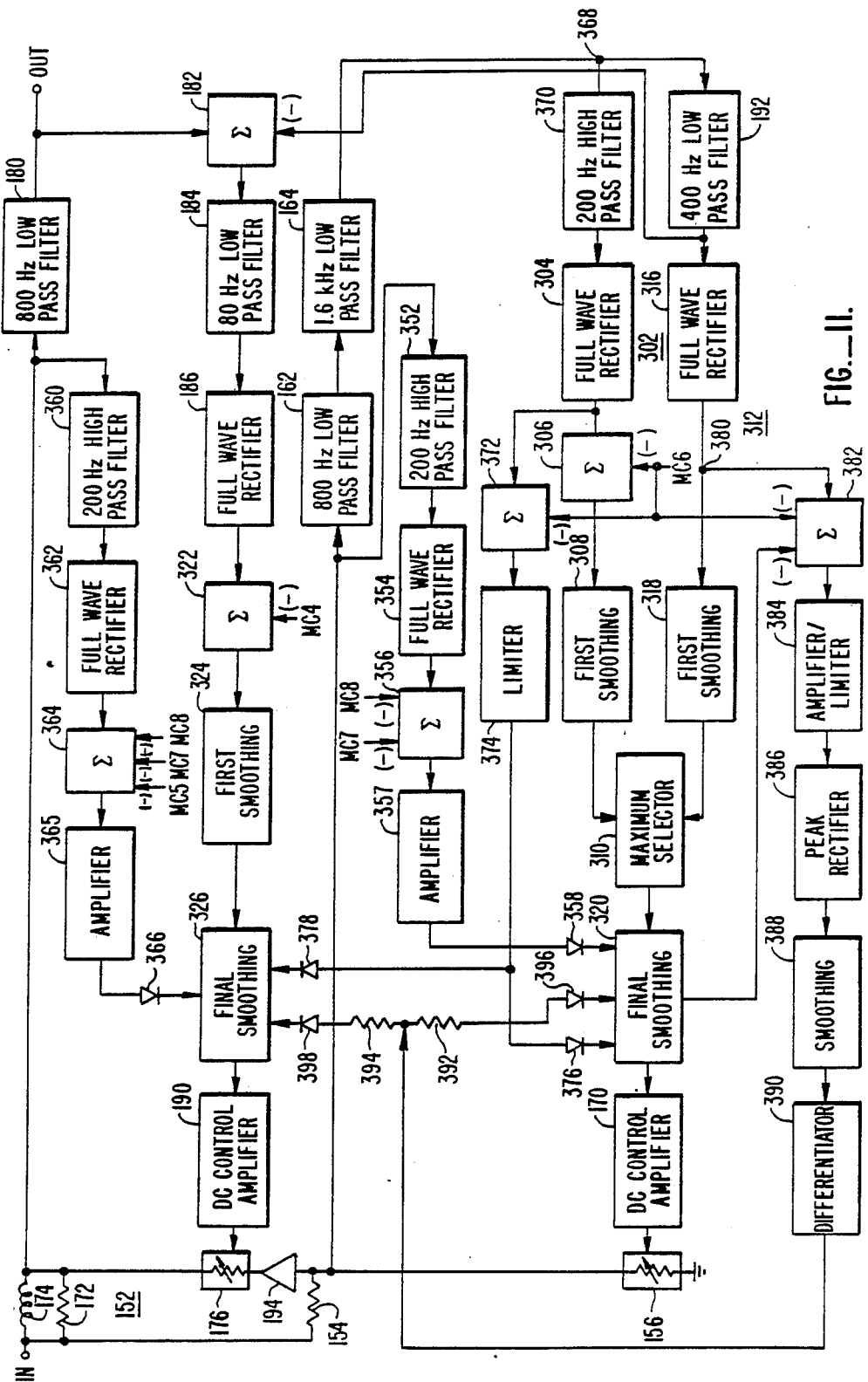
FIG._11.

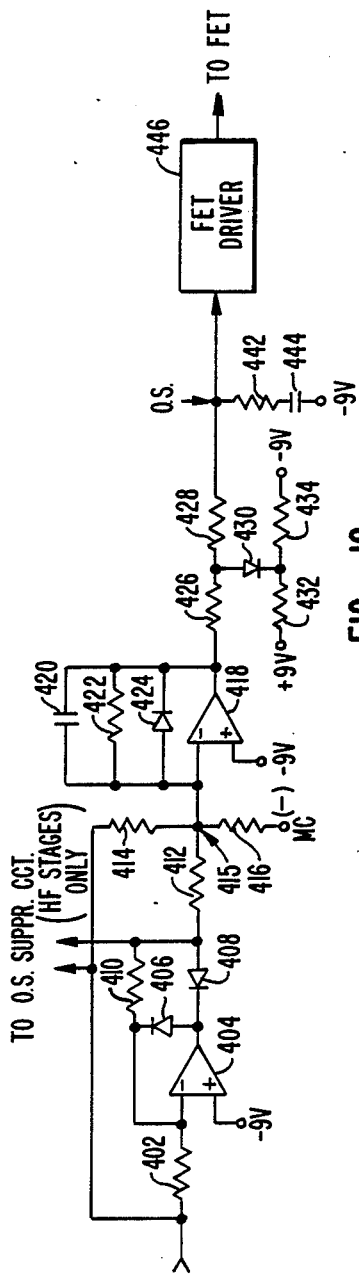
FIG._12.
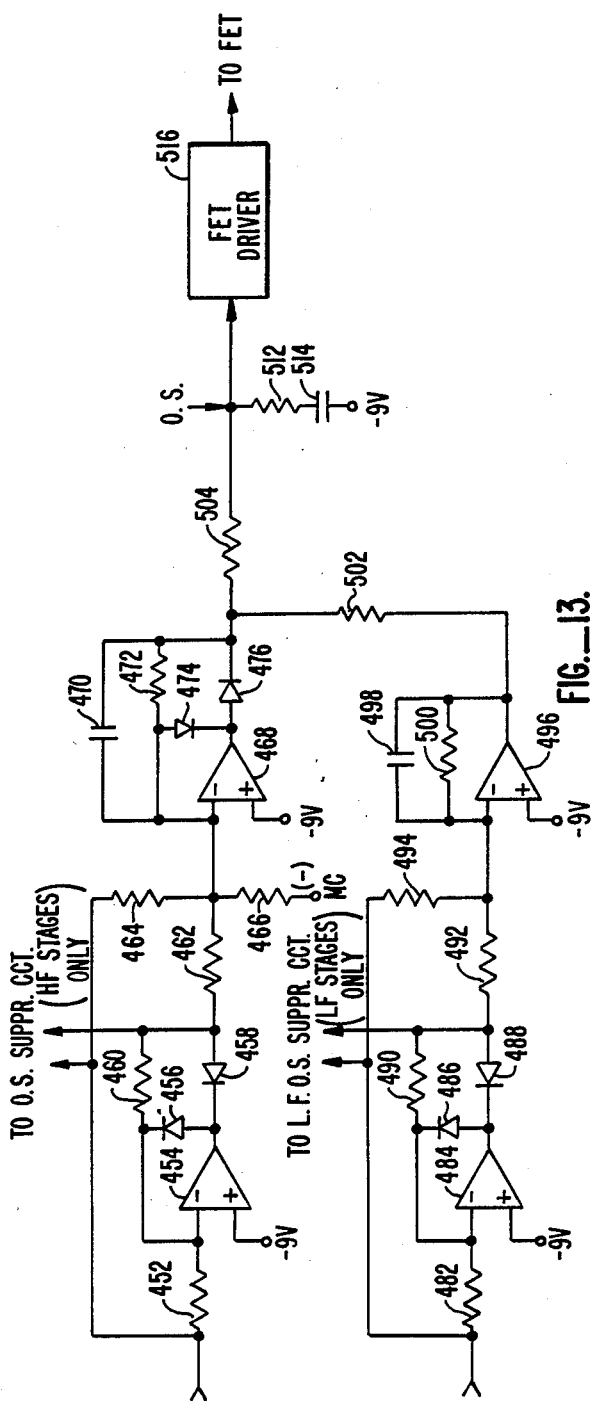
FIG._13.

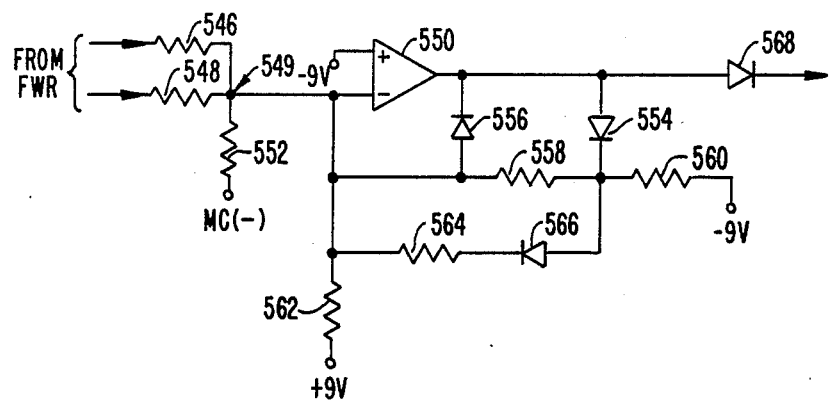
FIG._14.
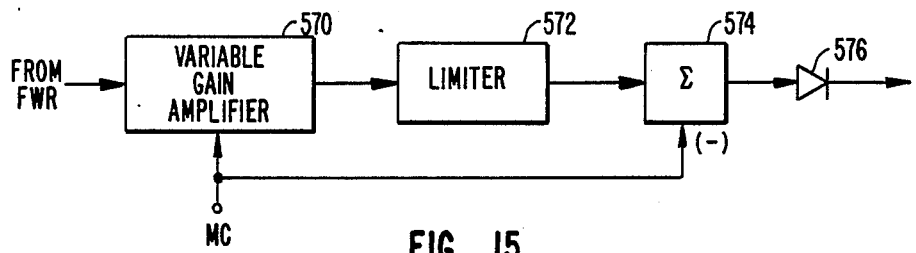
FIG._15.
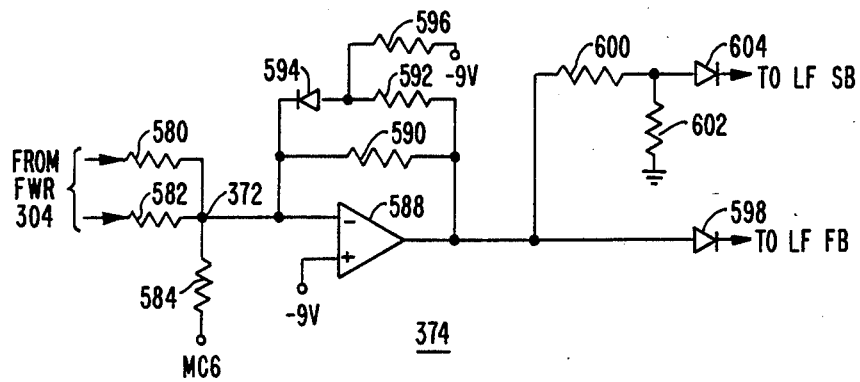
FIG._16.

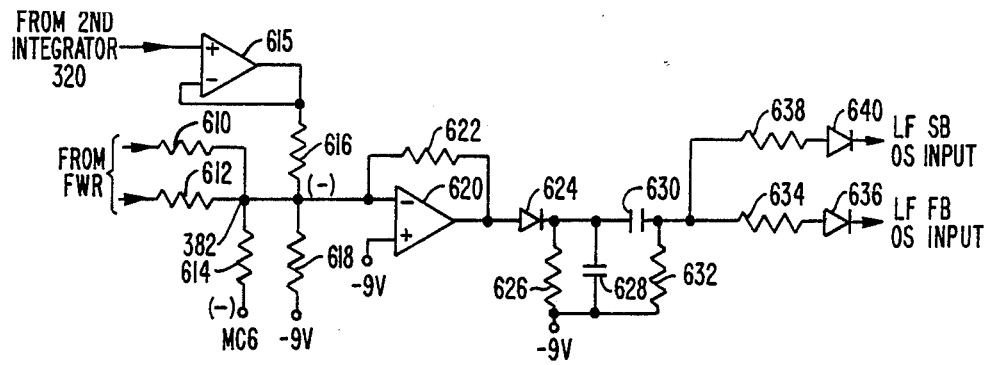
FIG._17.
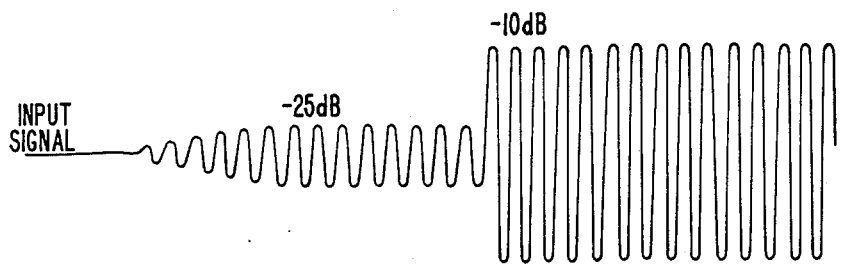
FIG._18.
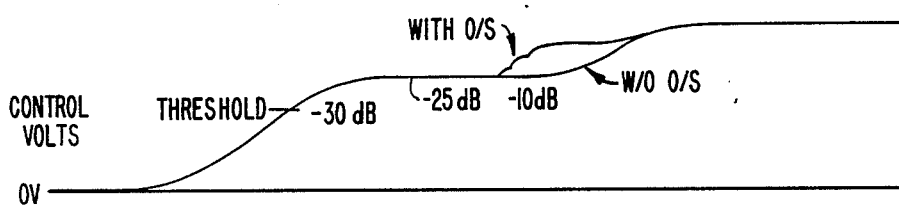
FIG._19.
FIG._20.
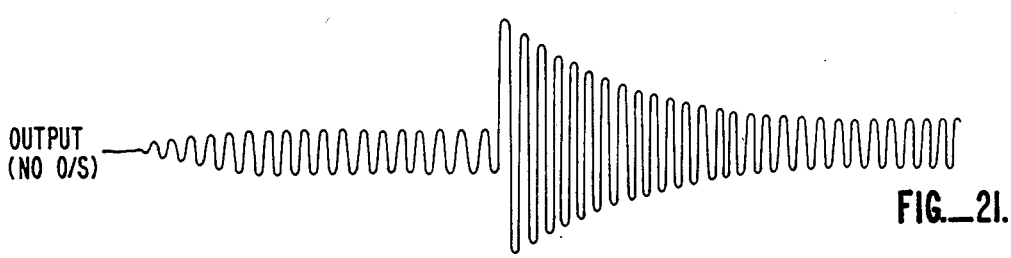
FIG._21.
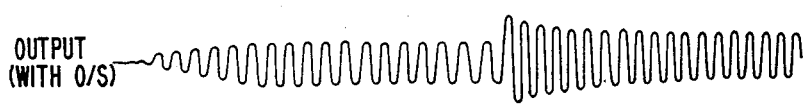
FIG._22.

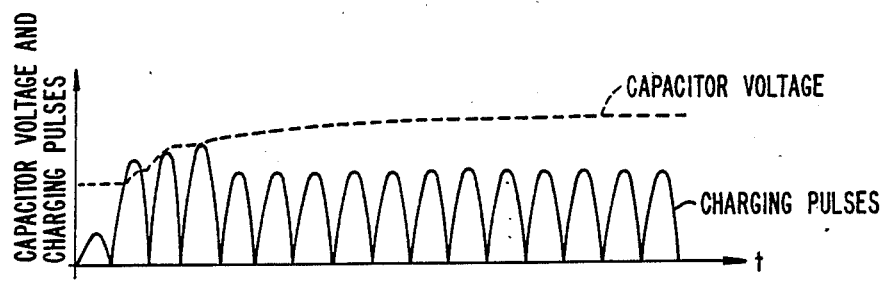
FIG._23.
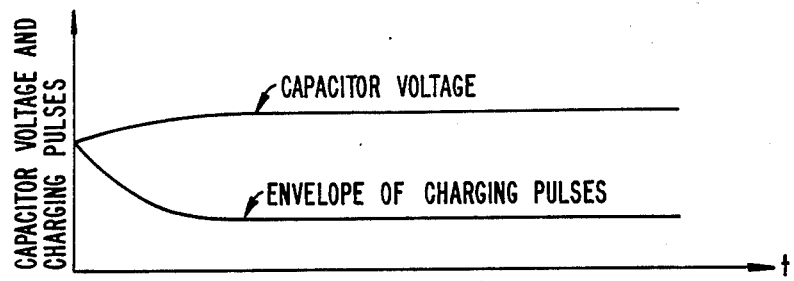
FIG._24.
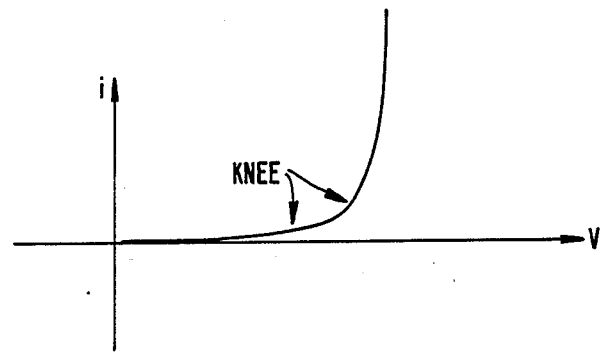
FIG._25.

TRANSIENT CONTROL ASPECTS OF CIRCUIT ARRANGEMENTS FOR ALTERING THE DYNAMIC RANGE OF AUDIO SIGNALS

BACKGROUND OF THE INVENTION

The present invention is concerned in general with circuit arrangements which alter the dynamic range of audio signals, namely compressors which compress the dynamic range and expanders which expand the dynamic range. More particularly, the invention relates to improvements in transient control aspects of circuit arrangements for altering the dynamic range of audio signals.

Compressors and expanders are normally used together (a compander system) to effect noise reduction; the signal is compressed before transmission or recording and expanded after reception or playback from the transmission channel. However, compressors may be used alone to reduce the dynamic range, e.g., to suit the capacity of a transmission channel, without subsequent expansion when the compressed signal is adequate for the end purpose. In addition, compressors alone are used in certain products, especially audio products which are intended only to transmit or record compressed broadcast or pre-recorded signals. Expanders alone are used in certain products, especially audio products which are intended only to receive or play back already compressed broadcast or pre-recorded signals. In certain products, a single device is often configured for switchable mode operation as a compressor to record signals and as an expander to play back compressed broadcast or pre-recorded signals.

A dominant signal component is a signal component having a substantial enough level so as to effect dynamic action within the frequency band under consideration. Under complex signal conditions there may be more than one dominant signal component or a dominant signal component and sub-dominant signal components. In a compander system which relies on complementarity of the compressor and expander, all of the signal components must be compressed and expanded in accordance with a defined compression/expansion law in order that the signal spectrum including the dominant signal component (and other signals affected by dynamic action) can be restored to their correct levels in the expander.

Sliding band circuits employ signal dependent variable filtering to provide dynamic action. Generally, a dominant signal component causes the cutoff or turnover frequency (or frequencies) of one or more variable filters (e.g., high pass, low pass, shelf, notch, etc.) to shift so as to compress or expand the dominant signal component. For example, for the case of high frequency audio compression or expansion a high frequency boost (for compression) or cut (for expansion) can be achieved by using a high pass filter with a variable lower corner frequency. As the signal in the high frequency band increases, the filter corner frequency slides upwardly so as to narrow the boosted or cut band and exclude the useful signal from the boost or cut. Such circuits can also be configured to act at low frequencies in which case low frequency boost or cut can be provided by way of a low pass filter with a variable upper corner frequency.

A sliding band system operating only in a single high frequency band is described in U.S. Pat. No. Re. 28,426 and U.S. Pat. No. 4,490,691. This system, which forms the basis for the well known consumer companding type audio noise reduction system known as B-type noise reduction, includes, in a dual path arrangement, a side path having a fixed high pass filter in series with a variable filter.

Fixed band circuits employ variable gain or loss devices to provide dynamic action. In fixed band circuits the compression or expansion is effected to the same degree within the entire frequency band in which the circuit operates.

Examples of fixed band circuits are to be found in U.S. Pat. No. 3,846,719; 3,903,485; and in *Journal of the Audio Engineering Society*, Vol. 15, No. 4, October, 1967, pp. 383-388. In the latter reference, the well known professional companding type audio noise reduction system known as A-type noise reduction is described. In that system, fixed band circuits are embodied in bandsplitting arrangements in which the frequency spectrum is split into a plurality of bands by corresponding bandpass filters and the dynamic action is essentially independent in each frequency band.

It is also possible to employ a single fixed band circuit operating throughout the input signal frequency band. Such arrangements are known as wideband compressors and expanders.

A "dual path" arrangement is one in which a compression or expansion characteristic is achieved through the use of a main path which is essentially free of dynamic action and one or more secondary or side paths having dynamic action. The side path or paths take their input from the input or output of the main path and their output or outputs are additively or subtractively combined with the main path in order to provide compression or expansion. Generally, a side path provides a type of limiting or variable attenuation (such as by way of a fixed band or sliding band circuit) and the manner in which it is connected to the main path determines if it boosts (to provide compression) or bucks (opposes) (to provide expansion) the main path signal components. Such dual path arrangements are described in detail in U.S. Pat. No. 3,846,719; 3,903,485; 4,490,691 and U.S. Pat. No. Re. 28,426.

Although it is possible to configure a sliding band circuit or a fixed band circuit using as the variable element an automatically responsive device, such as a diode type of limiting device, it is generally preferred to employ a controlled device that is responsive to a control signal The latter approach gives the circuit designer flexibility in controlling the operation of the circuit by performing operations on the control signal (for example, frequency selective and/or level dependent amplification of the control signal as done in the A-type and B-type systems).

In the A-type and B-type systems mentioned above, the source-drain path of field effect transistors (FETs) are employed as voltage controlled variable resistors (forming the variable element of a variable attenuator in the A-type system and forming the variable element of a variable filter in the B-type system). DC control voltages, derived from the input signals, are applied to the FET gates. The derivation includes rectification, smoothing, and adjustment of the control voltage amplitude as necessary to achieve the desired dynamic action. As the control voltage increases, the degree of limiting increases: by increasing the attenuation in the fixed band circuits and, in the sliding band circuits, by shifting the corner frequency of the filter farther and farther from its quiescent position.

One disadvantage of the control circuit arrangement in the A-type, B-type, and other known compander systems is that the DC control signal is formed from the linear additive combination of the pass-band signals and the stop-band signals reaching the control circuit. In the case of fixed band circuits in a bandsplitting system, the pass-band is the frequency band in which a particular circuit operates; the stop-band is the remainder of the signal spectrum handled by the system. In the case of sliding band circuits, the pass-band is the frequency band within the pass-band of the variable filter and the stop-band is the frequency band outside its pass-band. In an ideal circuit, compression or expansion should not be affected by the levels of signals outside the pass-band of the fixed band or the pass-band of the sliding band (whether or not in its quiescent position). A solution to the problem is set forth in U.S. Pat. No. 4,498,055.

In accordance with the teachings in U.S. Pat. No. 4,498,055, the formation of the DC control signal is altered, in a level dependent way, so as to make the DC control signal less responsive to stop-band signal components as the level of the input signal rises. In practical embodiments, this is accomplished by opposing (or bucking) the control signal with a signal referred to as the modulation control signal. In the case of a fixed band circuit, the modulation control signal assures that the amount of gain becomes no more than necessary to assure that a dominant controlling signal is not boosted (in the case of compression) above a reference level. In the case of a sliding band circuit, the modulation control signal assures that the amount of frequency sliding of the variable filter is no more than necessary to assure that a dominant controlling signal is not boosted (in the case of compression) above a reference level. In each case, the modulation control signal causes the DC control signal to be less than it would be otherwise for high level signals. As a consequence, for high level input signals, the output signals from the dynamic action circuit are higher than they would be otherwise.

A basic design conflict in companding type noise reduction systems is the requirement to balance the ability to handle rapidly changing waveforms (to minimize signal overshoots) against the desirability of minimizing signal modulation and noise modulation. The ability of a compressor (or expander) to respond to a rapid amplitude change in its input signal is directly related to its attack time or the time which is required for the device to change its gain (or shift its filter corner frequency) in response to the input amplitude change. Long attack times tend to reduce modulation distortion. When the change in input signal amplitude occurs more abruptly than the device is capable of changing its gain or corner frequency (caused by control circuit lag), an overshoot results. For example, if a compressor has a gain of two times (resulting from some steady state input condition) and suddenly the input signal doubles in amplitude such that that compressor is unable to reduce its gain to provide the desired gain according to its compression law, the output signal will exceed its desired amplitude and may exceed the desired maximum output of the device, depending on the amplitude jump and suddenness with which the input signal increases. Such an increase in output is referred to as an overshoot. Overshoots normally have maximum amplitudes equal in value to the degree of compression. The overshoot will continue until the input signal is suitably changed or, if the input signal remains constant at its new high level, until the control circuit time lag is sufficiently overcome so as to reduce the gain of the compressor to the gain directed by its compression law. Overshoots are undesirable because they can overload the channel or device carrying the output signal from the compressor.

Various companding systems have approached the problem of overshoots in different ways: fixed attack times, using a short attack time or a long attack time, and, variable attack times. A short attack time tends to minimize the amplitude and time of the overshoot but has an undesirable side effect in that rapid changes in gain cause significant modulation products to be generated. In order for such modulation products generated in a compressor to be cancelled, the compressed signal must be carried by a linear phase channel and the expander must provide reciprocal treatment. Such requirements are difficult or impossible to meet in practical situations. A long attack time has the advantage that modulation products are minimized but significant overshoots are produced. Accordingly, some companding systems have employed arrangements in which the attack time is variable, remaining relatively long during steady-state signal conditions but changing to a short attack time during input transients.

In the A-type system mentioned above, variable attack time control circuits are employed. In addition, the system is a dual-path arrangement that takes advantage of the fact that the side paths, in which the limiting takes place, should not have signals exceeding a predictable maximum amplitude. Accordingly, non-linear clipping is employed in the side paths as a back-up or secondary overshoot suppression in addition to the variable shortening of the control signal attack time. Because the signal level in the side paths are substantially less than that in the main path, the distortion introduced is small. In addition the non-linear clipping acts very briefly and infrequently.

As mentioned above, the introduction of the modulation control technique results in a larger output signal than would occur without modulation control. If modulation control were incorporated into a dual-path system, such as the A-type system, the signal in the side path would be larger than otherwise and would not have a predictable maximum amplitude: the side path signal would continue to rise with the input signal. Accordingly, a back-up overshoot suppression arrangement in the side path employing non-linear clipping at a fixed level would not be operable if modulation control were used.

The variable attack time control circuits used in the A-type system employ first and second integrators (smoothing circuits) coupled by components that include "speed up" diodes that function to decrease the attack time of the control circuit as the input signal transients become more and more extreme. However, in the absence of a back-up overshoot arrangement, the minimum attack time of the A-type system variable attack time control circuits cannot be shortened sufficiently to sufficiently suppress all overshoots likely to be produced.

Other known variable attack time control circuits have employed control circuits having a fixed attack time control path and a rapid attack time control path, both applied to the device under control. However, a significant drawback to that approach is that the resulting control signal, resulting from the addition of the signals from the control paths, has abrupt variations under transient input conditions causing distortion in the output signal.

SUMMARY OF THE INVENTION

In accordance with the teachings of the present invention, improved control circuits are provided for use in arrangements for altering the dynamic range of audio signals.

According to one aspect of the invention, the control circuit of a limiting device used in a compressor or expander includes a capacitor from which the control signal is derived, means having a relatively long time constant for charging the capacitor in response to steady-state input signal conditions, and means for charging the capacitor very rapidly in response to transient input signal conditions. The invention assures that the rapid increases in the capacitor voltage charge are accomplished in a controlled way so that the charge buildup is smooth with minimal discontinuities. In that way, distortion of the output waveform is minimized.

The steady-state portion of the control circuit preferably includes two integration or smoothing stages, but may be implemented using only a single smoothing stage. The time constant of the single or double smoothing stage is chosen to minimize modulation distortion without regard to overshoots. The transient portion of the control circuit includes at least one overshoot suppression circuit for rapidly charging the second (in the case of two smoothing stages) or the only (in the case of only a single smoothing stage) smoothing capacitor. In certain arrangements, particularly systems involving multiple stages, more than one overshoot suppression circuit contributes to rapidly and smoothly charging the smoothing capacitor. An essential feature, however, is that the control circuit has at least a primary overshoot suppression circuit which derives its input from the output signal of the stage which is controlled by the control circuit. In systems involving multiple stages, additional rapid charging for the capacitor may be derived from an associated stage in order to achieve a smoother or more accurate rapid buildup of the capacitor voltage charge than would be achieved using only the primary overshoot suppression circuit. In stages operating at low frequencies, an additional charging current, responsive to slow signal buildups, for smoothing discontinuities in the charging current from the primary overshoot suppression circuit is provided by a further circuit derived from low frequency components of the output signal of the stage or an associated stage.

The rectifiers and smoothing stages of the steady-state portion of the control circuits must yield a system with accurate characteristics even with phase dispersive transmission channels. To meet this requirement the rectifier and smoothing stages in the steady-state portion of the control circuits must at least be average (ideally, but with greater expense, RMS) responding. It is is not practical, for example, to employ a two stage smoothing arrangement in which the rectifier and first stage of smoothing has essentially a zero attack time because the steady-state properties of the control circuit are disturbed; the circuit would respond to clicks and other anomalies in the signal being treated.

It is known to use a small attack time constant (e.g., 1 ms) stage (a peak rectifier, for example) with a significant holding time (e.g., 10 ms) followed by a further smoothing stage with a long time constant. To accommodate transients, signals from the first peak holding circuit are transferred by a speed-up diode or added to the output of the second smoothing circuit. Such arrangements do not have good accuracy if the information channel alters the phase relations of the signal components significantly. Furthermore, the non-zero attack time of the first circuit slows the action of the compressor and significant overshoots may be produced.

The basic arrangement of one aspect of the present invention avoids such problems by employing a long time constant average responding rectifying and smoothing steady-state path and a separate overshoot suppression path that applies a raw rectified signal from the output of the variable gain element driving the steady-state path directly to the final smoothing capacitor. The overshoot suppression path has substantially a zero attack and decay time constant.

In a further aspect of the invention, modulation control techniques are employed and modulation control signals are fed in opposition to both the steady-state and overshoot suppression circuit portions of control circuits in order that those portions of the control circuit track each other as a function of signal level and frequency.

BRIEF DESCRIPTION OF THE DRAWINGS

FIG. 1 is a block diagram of a companding system in which the compressor and expander are configured as Type I devices, each having two side paths, a high frequency stage and a low frequency stage.

FIG. 2 is a block diagram of a companding system in which the compressor and expander are configured as Type II devices, each having two side paths, a high frequency stage and a low frequency stage.

FIG. 3 is a block diagram of a multi-stage companding system in which the compressor and expander each have three stages configured as Type I devices.

FIG. 4 is a block diagram of the steady-state aspects of a high frequency stage usable in the arrangements of FIGS. 1 through 3.

FIG. 5 is a block diagram of the steady-state aspects of a low frequency stage usable in the arrangements of FIGS. 1 through 3.

FIG. 6A is a phasor diagram used in explaining an aspect of the invention.

FIG. 6B is a further phasor diagram used in explaining an aspect of the invention.

FIG. 7 is a block diagram of the system of FIG. 3, showing where modulation control signals may be derived.

FIG. 8 is a block diagram showing the signal processing applied to derive the various modulation control signals.

FIG. 9 is a partially schematic block diagram showing the high frequency stage of FIG. 4 with the addition of transient aspects and the application of modulation control signals.

FIG. 10 is a partially schematic block diagram showing the low frequency stage of FIG. 5 with the application of modulation control signals.

FIG. 11 is a partially schematic block diagram showing the low frequency stage of FIG. 10 with the addition of transient aspects.

FIG. 12 is a schematic circuit diagram showing the main (steady-state) portion of the sliding band control circuits.

FIG. 13 is a schematic circuit diagram showing the main (steady-state) portion of the fixed band control circuits.

FIG. 14 is a schematic circuit diagram showing the primary overshoot suppression circuit used in the sliding band and fixed band control circuits.

FIG. 15 is a block diagram showing an alternative way of applying the modulation control signal(s) to the primary overshoot suppression circuit.

FIG. 16 is a schematic circuit diagram showing the secondary overshoot suppression circuit located in the low frequency fixed band stages.

FIG. 17 is a schematic circuit diagram showing the low frequency overshoot suppression circuit.

FIGS. 18 through 25 are examples of waveforms that are useful in describing the operation of the overshoot suppression circuits.

DETAILED DESCRIPTION

Although certain aspects of the present invention are usable in the context of other circuit arrangements, the invention will be described in connection with a three-stage compressor (and three-stage expander) system, the stages in turn being constructed of high frequency and low frequency sub-stages. The initial portion of this detailed description sets forth the environment for the various aspects of the present invention.

High frequency and low frequency stages of the type set forth in FIGS. 9-17 can be used as building blocks in creating compressors, expanders and noise reduction compandors. For example, high frequency and low frequency stages of the type described in FIGS. 9-17 may be employed as side paths in dual path arrangements in the manner shown in FIGS. 1, 2 and 3.

U.S. Pat. Re. 28,426; 3,846,719; 3,903,485; 4,490,691; and 4,498,055, referred to in this application, are each incorporated herein by reference, each in its entirety.

In FIG. 1, a Type I dual path arrangement (of the type generally described in U.S. Pat. No. 3,846,719) is shown having a compressor 8 in which the input signal is applied to the high frequency stage 10, to the low frequency stage 12 and to the main path 14. The outputs of stages 10 and 12 are summed in summing means 16 and then summed with the main path signal components in summing means 18 to provide the compressor output for application to a transmission channel. The side path signal components thus boost the main path signal components causing compressor action. The transmission channel output is applied to the expander 20, configured in a complementary manner to the compressor 10, having an input summing means 22 which receives the transmission channel output and subtracts the sum of the high frequency stage 10 and low frequency stage 12 outputs, which are added in summing means 24. The side path signal components thus buck the main path 26 signal components causing expander action.

In FIG. 2, a Type II dual path arrangement (of the type generally described in U.S. Pat. No. 3,903,485) is shown having a compressor 28 which has an input summing means 30 receiving the input signal and the sum of the high frequency stage 10 and low frequency stage 12 outputs, which are combined in summing means 32. The summing means 32 has its output applied to the main path 34 which provides the compressor output to the transmission channel and the input to the stages 10 and 12 of the compressor. The side path signal components thus boost the main path signal components causing compressor action. The transmission channel output is applied to the expander 36, configured in a complementary manner to the compressor 28. The input signal is applied to the high frequency stage 10, to the low frequency stage 12 and to the main path 38. The outputs of stages 10 and 12 are summed in summing means 40 and then subtracted from the main path signal components in summing means 42 to provide the expander output. The side path signal components thus buck the main path signal components causing expander action.

In the various dual path Figures, the main path of each compressor and expander is linear with respect to dynamic range and the level of the sum of the side path high frequency and low frequency stages is usually less than the maximum level of the main path. The transmission channel in the various Figures may include any type of storage or transmission medium and may also include means for converting or encoding the analog signal components from the compressor into a different form (digital, for example), the storage or transmission of the encoded signals, and means for re-converting or decoding the encoded signals back into analog signal components for processing by the expander.

In arrangements such as in FIGS. 1 and 2 where only one high frequency stage and one low frequency stage are used in each compressor and expander it is practical to provide a maximum of about 10 to 12 dB of noise reduction without reaching excessive maximum compression or expansion ratios. Although the arrangements of FIGS. 1 and 2 will be adequate in certain applications, it is useful to employ the teachings of U.S. Pat. No. 4,490,691 to achieve a greater amount of overall noise reduction without placing an undue burden on any one stage or creating excessive compression or expansion ratios.

In FIG. 3, one possible arrangement is shown in which there are three series Type I dual path stages in the compressor and three complementary stages in the expander. The threshold levels of the series bi-linear circuits are staggered. Alternatively, a Type II configuration could be employed. The embodiment of FIG. 3 also employs the spectral skewing and antisaturation aspects of U.S. Pat. No. 4,490,691, although these aspects are not essential to a multi-stage arrangement employing high frequency and low frequency stages of the type shown in FIGS. 9-17.

The compressor portion of the system of FIG. 3 has three stages: a high level stage 44, which has the highest threshold level; a mid-level stage 46; and a low level stage 48, which has the lowest threshold level. In a practical embodiment thresholds of about −30 dB, −48 dB, and −62 dB (relative to a reference level which is taken to be about 20 dB below the maximum level in the system), respectively, are employed. As discussed in U.S. Pat. No. 4,490,691 this is the preferred order of arrangement of staggered stages, although the reverse order is possible. The expander portion of the system of FIG. 3 also has three stages arranged complementary to the compressor: the low level stage 50, the mid-level stage 52, and the high level stage 54. Each high level and mid-level stage has both a high frequency stage 10 and a low frequency stage 12. The low level stages have only a high frequency stage 10 and no low frequency stage. Each high frequency stage 10 and each low frequency stage 12 preferably is of the type described in connection with FIGS. 6, 7, and 8. In practical circuits there may be some minor differences between or among high frequency and low frequency stages depending on whether it is located in the high level, mid-level or low level stage.

If each compressor stage (44, 46, 48) and each expander stage (50, 52, 54) has, for example, 8 dB of compression or expansion, respectively, then the overall compander system will provide 24 dB of noise reduction in the high frequency band (above 800 Hz, if the high frequency stages have an 800 Hz cutoff frequency) and 16 dB of noise reduction in the low frequency band (below 800 Hz, if the low frequency stages have an 800 Hz cutoff frequency). Such an arrangement is useful, for example, in a high quality audio noise reduction system of the type used in professional applications.

The input to the compressor portion of the system is applied to low frequency and high frequency spectral skewing networks shown as block 56. In a practical embodiment the high frequency network is a low pass filter with an attenuation characteristic like that of a 12 kHz two-pole Butterworth filter but with a limiting attenuation of about 35 dB (i.e., a shelf response). The low frequency network is a 40 Hz high pass filter, connected in series with the high frequency network, also with a two-pole Butterworth-like characteristic but with about a 25 dB limiting attenuation. Complementary de-skewing networks are located in block 86 at the output of the expander.

The main paths of the mid-level stage 46 and the low-level stage 48 in the compressor portion include a low frequency antisaturation network 58 and a high frequency antisaturation network 60, respectively. Complementary antisaturation networks 62 and 64 are located in the main path of stages 50 and 52, respectively, in the expander portion. As discussed in U.S. Pat. No. 4,490,691, it is possible to locate such networks in the main path of only one stage in the compressor and in the complementary location in one stage in the expander portion of a series of cascaded staggered stages. In a practical embodiment, the high frequency and low frequency antisaturation networks are operative above about 4 kHz and below about 100 Hz, respectively. There is an effective compounding of the antisaturation networks and the spectral skewing networks. The overall result is a low frequency antisaturation effect of about 10 dB at 20 Hz and 15 kHz.

The Type I stages of FIG. 3 also include summing means 66, 68, 70, and 72 that combine the outputs of the high frequency and low frequency circuits in stages 44, 46, 52, and 54, respectively. The stages each include summing means 74, 76, 78, 80, 82, and 84 in the main paths which couple to the main path the side path output, in the case of stages 48 and 50, or the outputs of the side paths, in the case of the other stages.

In operation, the main signal paths are primarily responsible for conveying high level signals. The noise reduction signals from the side paths are additively combined with the main signal in the encoding mode and subtractively in the decoding mode, whereby an overall complementary action is obtained. In FIG. 3, a dedicated encoder and decoder are shown laid out in a symmetrical fashion; other decoder configurations are possible in switchable circuits. For example, as is well known in the art, a complete encoder can be placed in the negative feedback loop of a high gain amplifier to form a decoder.

In FIG. 4, the steady-state elements of a high frequency stage 10 are shown. Additional explanation of the operation of FIG. 4 is given in connection with the description of FIG. 9, below. A single pole high pass filter 102 with a cutoff frequency of about 800 Hz. In practice, the filters throughout the various Figures are configured as passive RC filters in the inputs of operational amplifiers that act as buffers. The filtered input signal is applied to a fixed band element 106 and to a sliding band element 108.

A fixed band element achieves limiting by providing the same amount of gain reduction throughout the frequency band in which it operates in response to a dominant signal component. Fixed band elements can be configured as variable gain or variable loss devices as discussed in U.S. Pat. No. 4,498,055. An effective and economical implementation is to employ the source-drain path of an FET as a variable loss device (variable resistor) by controlling the voltage applied to its gate.

A sliding band element employs signal dependent variable filtering to achieve limiting. Generally, a dominant signal component causes the cutoff or turnover frequency (or frequencies) of one or more variable filters (e.g., high pass, low pass, shelf, notch, etc.) to shift so as to compress or expand the dominant signal component. A sliding band system also may be implemented effectively and economically by employing the source-drain path of an FET as the variable element (variable resistor) of a variable filter by controlling the voltage applied to its gate as described in U.S. Pat. No. Re. 28,426 and U.S. Pat. No. 4,490,691.

The fixed band element includes an input resistor 110, a shunt variable resistor 112 (the resistor 110 and variable resistor 112 thus functioning as a variable voltage divider), and a control circuit 114 that generates a DC control voltage which is applied to the gate of the variable resistor 112. The variable resistor resistance drops as the DC control voltage level increases, thus increasing attenuation. Fixed band control circuit 114 includes in its loop a high pass filter 116, having a corner frequency of about 400 Hz, a further high pass filter 143, having a corner frequency of about 1.6 kHz, a full-wave rectifier 118, a smoothing circuit 120, employed to smooth the control signal and to adjust the attack and release time constants of the control loop, and a DC control signal amplifier 122.

The sliding band element 108 includes parallel input resistor 124 and capacitor 126 which are shunted by variable resistor 128, the overall arrangement thus providing a variable filter (a variable high pass shelf characteristic that "slides" upward as the DC control voltage increases). The sliding band element has a control circuit 130 which includes a buffer amplifier 132, a summing means 134, a single pole high pass filter 136 having a cutoff frequency of about 10 kHz to provide high frequency emphasis, a full-wave rectifier 138, a smoothing circuit 140, and a DC control signal amplifier 142. The summing means 134 also receives as inputs bucking signals (signals that oppose the input from buffer 132) taken before and after high pass filter 143. The output of the fixed band element 106 is applied to the sliding band element 108 through buffer 144. The overall output is taken from filter 132.

In operation, the fixed band and sliding band elements operate in a manner that draws on the best features of both types of circuits. The operation can be described as "action substitution". In any particular stage, fixed band dynamic action is used whenever it provides best performance; sliding band operation is substituted whenever it has an advantage. In this way the best features of both methods are obtained, without the attendant disadvantages of each.

The substitution is effective on a continuous and frequency by frequency basis. For example, the output from a given high frequency stage will typically be from the fixed band for frequencies up to the dominant signal component and from the sliding band above that frequency. Conversely, the output from a low frequency stage will be from the fixed band for frequencies down to a low frequency dominant component and from the sliding band below that frequency. Thus, the overall circuit behaves like a two-band fixed band compressor circuit, with an 800 Hz crossover, in the region between any low and high frequency dominant signal components that may be present; the circuit responds like a two-band sliding band compressor below and above the frequencies of the dominant signal components.

The coupling of bucking signal components from the fixed band element to the control circuit of the sliding band element are useful in permitting different thresholds to be set in the elements while retaining adequate control circuit gain in the sliding band element at frequency extremes.

In FIG. 5, the steady-state elements of a low frequency stage 12 are shown. The input signal is applied to a fixed band element 150 and to a sliding band element 152. The fixed band element includes an input resistor 154, a shunt variable resistor 156, and a control circuit 158 that generates a DC control voltage which is applied to the gate of the variable resistor 156. Control circuit 158 includes in its loop a buffer amplifier 160, a first single pole low pass filter 162 having a corner frequency of about 800 Hz, a second low pass filter 164 having a corner frequency of about 1.6 kHz, a further low pass filter 192, having a corner frequency of about 400 Hz, a full-wave rectifier 166, a smoothing circuit 168, employed to smooth the control signal and to adjust the attack and release time constants of the control loop, and a DC control signal amplifier 170.

The sliding band element 152 includes parallel input resistor 172 and inductor 174 which are shunted by variable resistor 176 (a variable low pass shelf characteristic that "slides" downward as the DC control voltage increases). In practice, the inductor 174 is simulated by a gyrator circuit which includes operational amplifiers (gyrator circuits are well known). The sliding band element has a control circuit 178 which includes a single pole low pass filter 180, having a corner frequency of about 800 Hz, a summing circuit 182, a single pole low pass filter 184 having a corner frequency of about 80 Hz to provide low frequency emphasis, a full-wave rectifier 186, a smoothing circuit 188, employed to smooth the control signal and to adjust the attack and release time constants of the control loop, and a DC control signal amplifier 190. Low pass filter 180 is preferably located in the position shown in order to assist in suppressing undesired noise or any transient distortion generated in the low frequency stage. Alternatively, the filter may be located in the input to the arrangement as is done in the high frequency circuit of FIG. 4. The summing circuit 182 also receives an input bucking signal taken after low pass filter 192. The output of the fixed band element 150 is applied to the sliding band element 152 through buffer 194. The overall output is taken from filter 180 of the sliding band element 152.

In operation, the low frequency stacked fixed band and sliding band elements operate generally in the manner described above except that the sliding band element operates downwardly in frequency. One difference in the low frequency stage, as noted above, is that the band defining filter is located in the stage output rather than in the input as in the high frequency stage. The 400 Hz filter is also useful for providing differential control of the sliding band element only at low frequencies.

In the arrangements of U.S. Pat. No. 3,846,719; U.S. Pat. No. Re. 28,426; and U.S. Pat. No. 4,490,691 and in commercialized embodiments based thereon (marketed and licensed by Dolby Laboratories and known as the A-type, B-type, and C-type noise reduction systems) the noise reduction signal (from the side paths) is highly limited under high-level signal conditions. This high degree of limiting, beginning at a low-level threshold, is responsible for the low distortion, low overshoot, and low modulation distortion which characterize these systems.

As set forth in U.S. Pat. No. 4,498,055, it is is unnecessary to utilize such a low threshold and such a strong limiting characteristic under certain conditions. In particular, whenever the noise reduction signal departs from an in-phase condition with respect to the main path signal, then the threshold can be raised. Furthermore, after an appropriate degree of limiting has taken place at a given frequency (in order to create the desired overall compression law), then it is unnecessary to continue the limiting as the signal level rises. Rather, the level of the noise reduction signal can be allowed to rise as the input signal rises, stabilizing at some significant fraction of the main path signal level.

For example, in the fixed band portions of arrangements such as shown in FIGS. 4 and 5 the application of the teachings of U.S. Pat. No. 4,498,055 results in conventional performance in the pass-band (in-phase) frequency region. However, in the stop-band region the limiting threshold is allowed to rise and the degree of limiting is reduced. The possibility of doing this can be appreciated by consideration of the phasor diagrams of the two conditions: FIG. 6A which is the phasor diagram of a dual-path compressor in the pass-band, and FIG. 6B which is the phasor diagram of a dual-path compressor in the stop-band. In the pass-band (in-phase) condition the noise reduction signal and the main path signal add directly: therefore a relatively low threshold must be maintained at all pass-band frequencies. Outside the pass-band the effective amplitude contribution of the noise reduction signal may be minimal due to the phase difference between it and the main path signal; because of this it is possible to raise the threshold significantly and to reduce the limiting strength once the desired amount of attenuation has been obtained at a given frequency.

Similar considerations apply in sliding band circuits. In the B-type sliding band circuit (described in detail in U.S. Pat. No. 4,490,691), a variable filter follows a fixed filter, which has proved to be an efficient and reproducible arrangement. However, at frequencies outside the pass-band a pure two-pole filter results in overall amplitude subtraction because of the large phase angles created. Therefore, the type of filter which has been employed is only quasi-two-pole (a single pole fixed filter plus a variable shelf characteristic).

The same arrangement is used in the practical embodiment of the arrangement of FIG. 3, with one octave differences in the variable filter quiescent turnover points and the fixed filter turnover point (as in the B-type circuit). Above the threshold at a particular frequency the variable filter slides to the turnover frequency needed to create the overall (main path plus noise reduction signal) compression law. As the input level rises, and once an overall gain of unity is obtained, there is no reason for further sliding of the variable filter. At this point the modulation control arrangement as taught in U.S. Pat. No. 4,498,055 counteracts further sliding of the variable filter; this prevents unnecessary modulation of the signal and impairment of the noise reduction effect achieved during decoding.

The above effects in both fixed and sliding bands are created by circuits called modulation control circuits. Suitably filtered or frequency weighted signals from the main signal path are rectified, and in some cases smoothed, and are fed in opposition to the control signals generated by the control circuits of the various stages. The result at higher signal levels is to create a balance or equilibrium between the stage control signals and the modulation control signals. Under these conditions there is no further gain reduction or sliding of the relevant variable filters with increasing input signal levels.

As mentioned in U.S. Pat. No. 4,498,055, when modulation control techniques are embodied in multistage devices, the modulation control circuits need not be derived from within each individual stage. FIG. 7 shows a preferred arrangement for deriving modulation control signals for use in an encoder/decoder system such as shown in FIG. 3. As explained further below, eight modulation control signals, designated MC1 through MC8, are employed. The main modulation control signals MC1–MC7 are derived from the main path point between the mid-level stages 46 and 52 and the low level stages 48 and 50. In this way the modulation control signals begin to have a significant influence at relatively low levels, such as at −30 dB (relative to the reference level) because of the contributions of the high level and mid-level stages; the phase relationships between the modulation control signals and the signals in the control circuits of the several stages are also optimized. In the generation of MC8, which is used for low-frequency stage overshoot-suppression inhibition under high-frequency transient signal conditions, the influences of the noise reduction stages are undesirable. MC8 is therefore derived from a point between the high level stages 44 and 54 and the spectral skewing 56 and de-skewing network 86, respectively.

FIG. 8 shows further details of the modulation control circuits. MC1–3 are used for the high frequency stages 10; MC5–8 are used for the low frequency stages 12.

MC1 controls the high frequency sliding band circuits. The signal from the takeoff point is fed through a single-pole high pass filter 202 having about a 3 kHz corner frequency, full wave rectified in block 204, and fed in opposition to the control signals generated by the high frequency stages. MC1 is also smoothed by a two-stage integrator 208 having about a 1 ms (millisecond) time constant and is employed, as MC2, to oppose the operation of the high frequency sliding band overshoot suppression circuits (described below); the overshoot suppression thresholds thereby track the steady state thresholds. MC2 must be smoothed because the phase relationships of MC1 and the signals in the stages vary throughout the audio band (because of the sliding band action), being a function of frequency and level.

MC3 controls the high frequency fixed band circuits. The signal from the takeoff point is weighted by cascaded single-pole low pass filters 210, 212, having respective corner frequencies of about 400 Hz and about 800 Hz, full wave rectified in block 214, and fed in opposition to both the steady state and transient control circuits (the transient control circuit or overshoot suppression circuit, as it may alternatively be called, is described below) of the high frequency fixed band circuits. There is no need to provide a smoothed MC signal for the overshoot suppression circuits of the high frequency fixed band circuits because a fixed phase relationship exists between the signals of the fixed band circuits and the modulation control signal MC3 throughout the audio band.

MC4 controls the sliding band circuits of the low frequency stages. The signal from the takeoff point is fed through a single-pole low pass filter 216, having about a 200 Hz corner frequency, full wave rectified in block 218, and fed in opposition to the sliding band control signals generated in the stages. MC4 is smoothed by a two-stage integrator 222, having about a 2 ms time constant, to form MC5; this signal is used to control the low frequency sliding band overshoot suppression circuits (described below).

MC6 controls the low frequency fixed band circuits. The signal from the takeoff point is weighted by cascaded single-pole high pass filters 224, 226, having corner frequencies of about 800 Hz and 1.6 kHz, respectively, full wave rectified in block 228, and used to oppose the steady-state fixed band control signals. MC6 is also smoothed in a two-stage integrator 230, having a time constant of about 2 ms, forming MC7, which is used to control the low frequency fixed-band overshoot suppression circuit (described below). This smoothing is necessary in low frequency fixed-band stages because, unlike the situation in the high frequency fixed-band stages, there is no fixed phase relationship between the stage signals and the overshoot suppression signals. MC7 is also used in a supplemental way to control the low frequency sliding-band overshoot suppressors.

MC8 is used to control the overshoot suppression circuits of both the fixed and sliding band low frequency circuits. MC8 compensates for the fact that no frequency weighting is used in the generation of the low frequency primary overshoot suppression signals. High frequency transient signal components are detected and used to oppose the operation of the LF primary overshoot suppression circuits. The signal from the MC8 takeoff point is fed through a high pass filter 232, having about a 3 kHz corner frequency, full wave rectified in block 234, double differentiated with approximately 15 microsecond time-constants in block 236, and peak-hold rectified with about a 30 ms time-constant in block 238. The resultant high frequency transient modulation control signal MC8 is then employed to oppose the low frequency overshoot suppression action.

A side effect of the modulation control scheme is that at high signal levels the amplitudes of the noise reduction signals from the side paths are relatively high in comparison with the situation in the A-type, B-type, and C-type systems that do not employ modulation control. Because of this it is not possible to employ simple overshoot suppression diodes as in these previous systems (for example, clipping diodes 28 in FIG. 4 of U.S. Pat. No. Re. 28,426). According to one aspect of the present invention, overshoot suppression side circuits are used in parallel with a portion of the steady-state control circuit in order to provide a rapid but controlled decrease in attack time of the control circuit. Under extreme transient conditions, e.g. from a sub-threshold signal situation, the overshoot suppression threshold is set at its lowest point, about 10 dB above the relevant steady state threshold.

The steady-state thresholds in the various circuits are set by adjusting the control signal amplifier gain or variable gain element as mentioned in U.S. Pat. No. 4,490,691. The overshoot suppression thresholds are set as described below in connection with FIGS. 14 and 16. By adjusting the gain and bias in the steady-state and overshoot suppression paths of the control circuits the circuit designer has substantial flexibility in choosing the level at which the overshoot suppression begins to act and the gradualness with which it acts once it begins to act.

With high level steady-state signals and with complex signals (many frequencies) the threshold rises. The rising thresholds are achieved by applying basically the same modulation control signals to the overshoot suppression side circuits as to the steady state portion of the control circuits; since basically the same modulation control signals are used to control the steady state characteristics, there is a tracking action between the transient and steady state behavior. This arrangement results in both well controlled overshoots and low modulation distortion.

Both primary and secondary overshoot suppression circuits are employed, the latter acting as fall-back or long-stop suppressors under extreme complex signal conditions (e.g. high-level low and mid frequency signals in combination with high-level high-frequency signals). In the low frequency circuits a further overshoot suppressor is used for very low frequency signals; this is a very gentle, slow acting circuit which reduces low frequency transient distortion.

FIG. 9 adds the modulation control features and overshoot suppression circuit features to the steady-state high frequency stage described in connection with FIG. 4. Thus, FIG. 9 shows both the steady-state and transient control aspects of the high frequency stages. As with other block diagrams, this figure shows only the basic parameter determining elements; the practical circuits of course contain other details such as buffering, amplification, and attenuation. The high-level, mid-level, and low-level stages (of FIG. 3) have the same basic block diagrams and schematics. The main distinctions are that the AC and DC circuit gains are increased for the mid- and low-level stages.

Referring to FIG. 9, as in FIG. 4, each stage comprises a fixed band section on the bottom and a sliding band section on the top, each with its own control circuits. The same reference numerals are used for like elements in FIGS. 4 and 9. The fixed and sliding band circuits are fed in parallel and the output signal is taken from the sliding band circuit. The sliding band variable filter is referenced to the output of the fixed band; that is, the fixed band output is fed directly to the bottom end of the sliding band variable resistor 128. This connection results in the action substitution operation mentioned previously. The overall output will always be the larger of the fixed and sliding band contributions at all frequencies. If there is a signal situation in which the fixed band output is negligible, then the sliding band takes over. Conversely, if there is little or no sliding band contribution, the output from the fixed band will still feed through to the output through the sliding band variable resistor 128. In this way the action of one circuit is substituted for that of the other circuit as the occasion requires.

The incoming signal is fed through a single-pole high pass filter 102, having a corner frequency of about 800 Hz. The output signal is taken from the sliding band stage and is fed through buffer 132. Thus, the overall quiescent (sub-threshold) frequency response of the circuit is that of a single-pole 800 Hz high pass network. The low frequency stages have a complementary 800 Hz single-pole low pass characteristic, which overall results in optimal combination of the signals from the high and low frequency stages.

The fixed band output from the fixed band variable resistor 112 is fed via weighting filter 116 to two control circuits, the main (pass-band and stop-band) control signal circuit 252 and the pass-band control circuit 254. This arrangement is similar to FIG. 21 of U.S. Pat. No. 4,498,055. In the main control circuit the signal is full wave rectified (all control circuit rectifiers in the system are full wave) in block 256 and opposed in combining means 258 by the modulation control signal MC3. The resulting DC signal is smoothed by a smoothing circuit 260 with about an 8 ms time constant (the overall steady-state control signal characteristic in this and all other stages is average responding—an important feature in a practical companding system). The control signal is then fed to one input of a maximum selector circuit 262, which passes to its output the larger of two signals applied to the input.

The fixed band output is also fed to the pass-band control circuit 254, which comprises the 1.6 kHz single-pole high pass filter 143, a rectifier 266, and a smoothing circuit (about 8 ms) 268. The pass-band control signal is applied to the other input of the maximum selector circuit. The output of the maximum selector circuit is further smoothed by about a 160 ms time constant in block 270 and is used to control the fixed band variable resistor 112 via variable resistor driver 122.

The dual control circuit arrangement described above is employed to obtain optimal performance under both simple signal (single dominant signal) and complex signal (more than one dominant signal) situations. The modulation control signal MC3 is optimized in frequency weighting and amount for simple signal conditions, in which the modulation control action is most useful. Under complex signal conditions, however, the modulation control signal developed becomes larger, and the subsequent modulation control action is then greater than necessary; that is, the DC control signal output from the main control circuit is less than required. Under this condition the control signal from the pass-band circuit is phased in, via the maximum selector circuit, to control the overall action of the fixed band compressor circuit.

The output of the fixed band element is fed through buffer 144 with an overall gain of unity to provide the reference for the sliding band filter; this is the only signal output of the fixed band circuit.

The sliding band control signal is derived from the stage output. The signal is fed through the 10 kHz single-pole high pass weighting network 136 and is rectified. The rectified signal is opposed in combining means 272 by modulation control signal MC1; since MC1 also has a single-pole high pass characteristic, the ratio between the rectified control signal and MC1 monitors the signal attenuation (this ratio creates an end-stop effect on the sliding band action). The result is smoothed first in block 274 by a time constant of about 8 ms and finally in block 276 by a time constant of about 75 ms. The smoothed control signal is then used to control the sliding band variable resistor 128 via variable resistor driver 142. A single control circuit suffices in the sliding band circuit because the 10 kHz high pass control weighting network 136 tends to offset the effect of complex signals on the modulation control voltage developed (MC1).

A modification is made in the control characteristic at low levels. Signals from the fixed band circuit are combined in combining means 134 in opposition with the sliding band output signal. The effect is in the direction of simulating the derivation of the sliding band control voltage from the voltage across the sliding band variable filter only (i.e. from the voltage across variable resistor 128). This tends to raise the sliding band threshold at high frequencies, which reduces unnecessary sliding of the band. The 10 kHz control weighting network provides the correct amount of control signal for the variable filter at medium and high levels, but it produces the undesirable side effect of lowering the threshold at high frequencies; the differential control signal derivation method counteracts this threshold lowering effect.

The overshoot suppression arrangements for the high frequency stages are also shown in FIG. 9. In the high frequency circuits a general feature is that unsmoothed rectified signals from the control circuit rectifiers 256 and 138 are opposed by appropriate modulation control signals and are fed via diode means to the final smoothing circuits 270 and 276, respectively, particularly the capacitors therof. The low frequency arrangements follow the same pattern, with some modifications as described below.

In common with the A-type, B-type, and C-type systems, the overshoot suppression thresholds in the present arrangments are significantly higher than the steady-state thresholds. Preferably, the low level overshoot suppression levels are set at about 10 dB above the relevant steady-state thresholds; the overshoot suppression effects are then phased in gradually. The net result is that for most musical signals the overshoot suppressors rarely operate; the compressors are controlled by well smoothed signals. When the suppressors do operate, the effect is so controlled that modulation distortion is minimal. Under relatively steady-state, but nonetheless changing, signal conditions the overshoot suppression effects are gradually phased out with increasing signal levels; this action further ensures low overall modulation distortion from the system. The circuit configuration gives the circuit designer the ability to adjust the relative thresholds and the gradual phase in of the overshoot effects. As mentioned above, the thresholds are set by adjusting the gain and bias of the amplifiers in the steady-state and overshoot suppression circuits. As explained in further detail below, the gradual phasing in of overshoot suppression effects is accomplished by operating the coupling diodes (coupling the overshoot suppression circuits to the capacitor from which the control signal is derived) as variable resistors. Other, more complex circuits may be employed to achieve this function. Also explained in greater detail below, the gradual phasing out of overshoot effects is achieved by limiting circuits that reduce the gain of the overshoot suppression circuits at very high levels as well as by the modulation control signals that oppose the overshoot suppression signals at high levels.

Referring again to FIG. 9, in the high frequency fixed band circuit the overshoot suppression signal is derived from rectifier 256 of the main control circuit 252. As with the steady-state control signal, the rectified signal is opposed by MC3 in combining means 278, so that the overshoot suppression threshold is appropriate for conditions in the steady-state regime. The appropriate AC and DC conditions are set in amplifier stage 279. As compared with the steady-state circuit, the gain of the overshoot suppression side circuit is less than unity. The resultant overshoot suppression signal is coupled by a diode means 280 to the final smoothing circuit 270, particularly the capacitor thereof.

In the sliding band circuit two overshoot suppression signals are used, primary and secondary. The primary overshoot suppression signal is derived from the control circuit rectifier 138, opposed in combining means 282 by MC2, a smoothed version of MC1 (MC1 controls the steady-state characteristics), the appropriate AC and DC conditions are set in amplifier stage 283, and coupled to the final smoothing circuit 276, particularly the capacitor thereof, via diode means 284. As in the fixed band, the gain of the overshoot suppression side circuit is less than unity. The smoothing of MC1 to create MC2 is necessary because, unlike the situation in the fixed band circuit, there is no constant and favorable phase relationship between the signal in the control circuit and MC1 (because of the sliding band); the smoothing enables reliable and effective bucking action to take place.

The effect of the primary overshoot suppression circuit preferably is maximized for the most significant transient signal situation—that is, a single impulse or tone burst starting from a sub-threshold signal level. However, under certain signal conditions, especially those in which relatively steady-state high frequency signals at high levels are present, a side effect of the use of a smoothed MC2 signal is that the overshoot suppression level for low and medium frequency transient signals is raised. To overcome this effect a secondary overshoot suppression signal is derived from the fixed band overshoot suppression signal and is coupled via diode means 286 to the sliding band final smoothing circuit 276, particularly the capacitor thereof; the secondary overshoot suppressor has a higher threshold than the primary suppressor and operates only rarely because of the unusual circumstances for which it was designed.

It may be noted that of all the compressor and expander circuits in the system, the high frequency fixed bands uniquely require only a single overshoot suppressor, which combines both the primary and secondary functions. In these circuits the phase relationships of the modulation control signal MC3 and the signals used to derive the control signals are essentially ideally matched, whereby it is unnecessary to employ any modulation control smoothing to obtain optimal bucking action.

FIG. 10 shows the steady-state layout of the low frequency stages as in FIG. 5 along with the modulation control aspects of the arrangement. As with the high frequency stages, only the basic parameter determining elements are shown. The high level and mid-level low frequency stages have the same block diagrams and circuits, but the AC and DC gains are increased for the mid-level stage.

Referring to the FIG. 10, certain similarities and differences may be noted with respect to the high frequency stage described in connection with FIG. 9. The dual-layer arrangement of the fixed band on the bottom and the sliding band on the top is similar. However, the sliding band acts downwardly, using a simulated inductance (gyrator circuit). As with the high frequency stages, the fixed and sliding band circuits are fed in parallel, and the output signal is taken from the sliding band circuit. The fixed band output is coupled to the bottom of the sliding band to provide the action substitution operation discussed previously.

A notable difference from the high frequency circuit is that the fixed 800 Hz band determining filter follows, rather than precedes, the variable filter. This arrangement has several advantages: (a) overshoot suppression signals can be generated without the delay inherent in a low pass filter, resulting in lower transient distortion, (b) any transient distortion produced by the circuit is attenuated by the 800 Hz low pass filter, and (c) noise generated by the gyrator circuit is attenuated by the filter.

Referring to the fixed band section 150, the incoming signal is applied directly to the variable attenuator circuit provided by resistor 154 and variable resistor 156. Control circuit frequency weighting is provided by cascaded single-pole 800 Hz and 1.6 kHz low pass filters 162, 164. The main control circuit 302 rectifies the filtered signal in block 304; the resulting DC signal is bucked by modulation control signal MC6 in combining means 306, smoothed in block 308 by a smoothing circuit with about a 15 ms time constant, and fed to one input of the maximum selector circuit 310. The maximum selector circuit has the same purpose and mode of operation as in the high frequency circuits.

The 800 Hz and 1.6 kHz frequency weighted output of the fixed band circuit is also fed to the pass-band control circuit 312. Here the control signal is further weighted by a 400 Hz single-pole low pass filter 192, rectified in block 316, smoothed by a smoothing circuit with about a 15 ms time constant in block 318, and fed to the other input of the maximum selector. The larger of the two signals is passed to the final smoothing circuit (about 300 ms) 320 to become the fixed band control signal applied to variable resistor 156.

As in the high frequency circuits, the sliding band control signal is derived from the stage output—that is, from a point following both the fixed 800 Hz band determining filter and the variable filter. The signal is frequency weighted by an 80 Hz single-pole low pass filter 184, rectified in block 186, and bucked in combining means 322 by modulation control signal MC4 (which also has a single-pole low pass characteristic, with the same type of sliding band end-stop effect as in the high frequency circuits). The result is smoothed by a smoothing circuit 324 with about a 7.5 ms time constant and finally smoothed by a smoothing circuit 326 with a time constant of about 150 ms to become the sliding band control signal applied to variable resistor 176. As in the high frequency stages, a single control circuit suffices for the sliding band.

The same type of low level control characteristic modification is made in the low frequency circuits as in the high frequency circuits. Namely, a signal from the fixed band is combined in opposition with the sliding band output signal in combining means 182. The modification raises the sliding band threshold at low frequencies.

FIG. 11 adds the overshoot suppression circuitry to the low frequency stage shown in FIG. 10. In a manner generally similar to that of the high frequency circuits, unsmoothed rectified signals derived from the outputs of the variable elements are opposed by appropriate modulation control signals and are fed via diode means to the final smoothing circuits, especially the capacitor in each such circuit.

Both the fixed and sliding bands each have primary and secondary overshoot suppression circuits, which operate at frequencies above about 100 Hz. Additionally, both have gentle and slow-acting low frequency overshoot suppression circuits, operating at frequencies below about 200 Hz; there is a crossover effect between the two types of overshoot suppression in the 100–200 Hz region. As in the high frequency circuits, the primary overshoot suppression circuits provide the earliest and strongest suppression effect in simple transient situations. With more complex signals the primary overshoot suppression thresholds rise as the modulation control signal(s) oppose the overshoot suppression action and eventually the secondary overshoot suppression circuitry takes control.

In contrast with the high frequency situation, the low frequency general strategy is to derive the primary control signals from signal points that do not include any control circuit frequency weighting. This is because the required control circuit weighting networks of the low frequency stages are low-pass in character, resulting in delays (the high-pass networks used for control circuit weighting in the high frequency stages do not introduce delays). However, because of the lack of a weighting factor in the primary control signal, there is no inherent tracking between the steady-state and overshoot suppression thresholds of the circuits involved, particularly in the stop-bands. Therefore, further modulation control techniques are employed to obtain the required tracking The secondary overshoot suppression signals are derived from a point in the fixed band circuitry that provides adequate tracking in both the fixed and sliding bands.

Referring to FIG. 11, the fixed band primary overshoot suppression signal is generated by passing the variable attenuator output through a 200 Hz single-pole high pass filter 352. This filter reduces the influence of the primary overshoot suppression circuit at low frequencies, allowing the more gentle low frequency overshoot suppression circuit to take over the transient control function. The signal is full wave rectified in block 354 and then opposed in combining means 356 by modulation control signal MC7, a 2 ms (approximately) smoothed version of MC6, the fixed band steady-state modulation control signal; the effect is in the direction of improving the steady-state and overshoot suppression threshold tracking on a steady-state basis. However, the thresholds must also track on a transient basis. This is the function of the high frequency transient modulation control signal MC8, which is a high-frequency weighted, peak-detected signal that opposes the primary overshoot suppression signal in the time interval before MC7 becomes effective. The appropriate AC and DC conditions are set in amplifier 357 and the overshoot suppression signal is then coupled via diode means 358 to the final smoothing circuit 320, especially the capacitor thereof, of the fixed band circuit. The gain of the overshoot suppression side circuit is less than the gain of the steady-state control circuit.

In the generation of the sliding band primary overshoot suppression signal the output of the variable filter is fed through a 200 Hz single-pole filter 360 to reduce the effect of the circuit at low frequencies, as in the fixed band circuit. The signal is full wave rectified in block 362 and then opposed in combining means 364 by modulation control signals MC5 and MC7 to provide an adequate degree of tracking between the steady-state threshold and the overshoot suppression threshold on a steady-state basis. As in the fixed band circuit, MC8 provides the required degree of tracking on a transient basis. The appropriate AC and DC conditions are set in amplifier 365 and the resultant overshoot suppression signal is coupled via diode means 366 to the sliding band final smoothing circuit 326, especially the capacitor thereof. The gain of the overshoot suppression side circuit is less than the gain of the steady-state control circuit.

The secondary overshoot suppression signals for both the fixed band and sliding band are generated from the frequency weighted point 368 (at the output of the 800 Hz low pass filter 162 and the 1.6 kHz low pass filter 164) in the fixed band steady-state control circuit. To prevent interference with the low frequency overshoot suppression circuit at low frequencies, the signal is further filtered by a 200 Hz single-pole high pass network 370, as in the primary overshoot suppression circuits; the filtered signal is then rectified in block 304. On a steady-state basis the pass-band control circuit 312 controls the circuit at very low frequencies, via the maximum selector circuit; this arrangement allows the main control circuit rectifier 304 to serve a double function. The DC signal is opposed by MC6 in combining means 372, so that an optimal phase relationship is obtained between the rectified signal and MC6, apart from the effect of the 200 Hz filter 370 (which is negligible). An ideal tracking effect is also achieved between the steady-state and secondary overshoot suppression thresholds.

The effect of the 800 Hz and 1.6 kHz frequency weighting networks 162, 164 is to introduce a time delay into the secondary overshoot suppression signal. The effective delay is significantly reduced by using a higher (approximately times two) gain in the secondary overshoot suppressor circuit than in the primary circuit and applying limiting in block 374 (thus the effective rise time of the waveform is shortened). The resultant overshoot suppression signal is more in the nature of a nearly fixed amplitude impulse, applied in the rare circumstances when necessary, than it is a proportional response. The signal is coupled through diode 376 means to the fixed band final smoothing circuit 320, especially the capacitor thereof, and is also used, suitably biased (see FIG. 16, below, the feed is via resistors 600 and 602, the former having a value of about 2 kilohms while the latter has a value of about 47 kilohms), for secondary overshoot suppression in the sliding band circuit, also coupled through diode means 378.

The low frequency overshoot suppression signal is developed by tapping at point 380 the rectified, but unsmoothed, output of the pass-band control circuit 312 of the fixed band circuit. The signal is opposed in combining means 382 by MC6 to desensitize the circuit to high-level, high frequency components. The signal is further opposed by the resulting fixed band smoothed control signal from the final smoothing circuit 320, in a negative feedback fashion (when the fixed band control signal has risen to a sufficient level, there is no further need for any LF overshoot suppressor action.) The signal is then highly amplified and limited in block 384, peak rectified in block 386, and smoothed by a smoothing circuit 388 having about a 20 ms decay time constant. The resulting high amplitude pulses are fed through a differentiating network 390, with a time constant of the same order as the smoothing time constant, to provide low frequency overshoot suppression impulses of defined strength for distribution to the fixed band and sliding band final integrators, via high value resistors 392, 394 and series diode means 396, 389, respectively. The result is a decaying "constant current" charging of the capacitors of the final smoothing circuits. This is in contrast with the higher peak currents and correspondingly more abrupt control voltage changes produced by the relatively low-impedance primary and secondary overshoot suppressors. The use of the low frequency overshoot suppression method results in low waveform distortion of relatively slowly changing low-frequency signal impulses applied to the system. Additional explanation of the low frequency overshoot circuit is given below in connection with the description of FIG. 17.

FIG. 12 is a schematic diagram showing the circuit details of the main (steady state) portion of the sliding band control circuits employed in the high frequency and low frequency stages. The circuit is fed from filter 136 in the high frequency stage (FIG. 9) and from filter 184 in the low frequency stage (FIG. 11). The full wave rectifier (138, FIG. 9; 186 FIG. 11) employs the technique in which double the output of a unity gain inverting half wave rectifier is added to the input signal. Thus, the input signal is applied through resistor 402 to the inverting input of operational amplifier 404, the non-inverting input of which is connected to minus 9 volts. Diodes 406, 408, resistor 410, input resistor 402, and operational amplifier 404 operate as a half-wave rectifier. The input signal is fed to a summing point 415 (282, FIG. 9; 322 FIG. 11) through summing resistor 414 which has double the resistance of summing resistor 412 that receives the half-wave rectifier output. The same full wave rectification technique is used throughout the various circuits: however, other full wave circuits may be used. In the high frequency stages, the input signal and the half-wave rectifier output are applied to summing resistors in the overshoot suppression side circuit (FIG. 14, below). The summing node 415 also has applied to it the bucking modulation control input via a summing resistor 416. The modulation control input "bucks" the other signals at node 415 in the sense that it tends to reduce their amplitude. In the high frequency stage the modulation control input is MC1; in the low frequency stage it is MC4. The modulation control arrangement is similar to that described in U.S. Pat. No. 4,498,055, particularly FIG. 11 thereof.

The summing node operates in cooperation with operational amplifer 418 that functions not only as a summing amplifier but also as the first smoothing circuit (274, FIG. 9; 324, FIG. 11). The input is applied to the inverting input of amplifier 418 and its non-inverting input is connected to minus 9 volts. Capacitor 420, resistor 422, and diode 424 are connected in parallel in the feedback path of amplifier 418. The first smoothing stage time constant is about 8 ms. In certain relatively non-critical applications it is possible to eliminate the first smoothing stage entirely.

The first smoothing circuit output is applied to the second smoothing circuit stage (276, FIG. 9; 326, FIG. 11). The second smoothing stage includes the main smoothing resistor 428 and the smoothing capacitor 444 having a time constant of about 75 ms in the high frequency stages and about 150 ms in the low frequency stages. The charging path includes a lower valued resistor 426 to provide a suitable point, the junction of resistors 426 and 428, for the connection a limiter diode 430. Resistor 432 connected to the nominal positive supply voltage of plus 9 volts and resistor 434 connected to the reference potential bias the diode. The bias is set so that under extremely high level high frequency conditions the signal going to the controlled variable resistive element (implemented using a FET) does not go up into the gate conduction region of the FET (conduction of the FET may cause an audible thump in the output of the system). A low valued resistor 442 is located in series with the second smoothing circuit capacitor.

The second smoothing circuit capacitor 444 also receives charging inputs from several overshoot suppression circuits. In the high frequency stages the inputs are from the primary overshoot suppression circuit (FIG. 14) forming part of that high frequency sliding band circuit through diode 184 (FIG. 9) and a secondary overshoot suppression input via diode 186 (FIG. 9) from the primary overshoot suppression circuit associated with the related high frequency fixed band circuit. Resistor 442 buffers the output of the overshoot suppression circuits to prevent the operational amplifier in those circuits from going into high frequency oscillation. All of the charging inputs, the steady-state input from the first smoothing circuit and the inputs from the overshoot suppression circuits contribute to the charging of the second smoothing circuit capacitor, from which the control signal is derived.

A DC control amplifier (FET driver) 446 (142, FIG. 9; 190, FIG. 11) drives the sliding band FET (variable resistor 128, FIG. 9) in accordance with the voltage on the second smoothing circuit capacitor 444.

FIG. 13 is a schematic diagram showing the circuit details of the main (steady state) portion of the fixed band control circuits employed in the high frequency and low frequency stages. The arrangement of pass-band and main (pass-band plus stop-band) sub-circuits and the application of the modulation control signal to the main sub-circuit is similar to that described in U.S. Pat. No. 4,498,055, particularly FIG. 21 thereof.

The input signal to the main portion (252, FIG. 9) of the control circuit is derived directly from the fixed band element 106 (FIG. 9) output via a buffer amplifier (not shown) in the high frequency stages. In the low frequency stages, the main portion (302, FIG. 11) of the control circuit is derived from the output of filter 164 (FIG. 11) through the 200 Hz high pass filter 370 (FIG. 11). The main control circuit has a full wave rectifier (256, FIG. 9; 304, FIG. 11) configured in the same way as the full wave rectifier in the circuit of FIG. 12. The full wave rectifier includes operational amplifier 454, input resistor 452, diodes 456, 458, feedback resistor 460, and summing resistors 462 and 464. In the high frequency stages, the input signal and the half-wave rectifier output are applied to summing resistors in the overshooot suppression side circuit (FIG. 14, below). The summing node 465 (258, FIG. 9; 308, FIG. 11) receives the full wave rectifier output and also has applied to it the bucking modulation control input via a summing resistor 466. The modulation control input bucks the other signals at node 258 in the sense that it tends to reduce their amplitude. In the high frequency stage the modulation control input is MC3; in the low frequency stage it is MC6.

The summing node operates in cooperation with operational amplifier 468 that functions not only as a summing amplifier but also as the first smoothing circuit (260, FIG. 9; 308, FIG. 11). The input is applied to the inverting input of amplifier 468 and its non-inverting input is connected to minus 9 volts. Capacitor 470 and resistor 472 are connected in parallel in the feedback path of amplifier 468. Diodes 474 and 476 are connected so as to form a maximum selector circuit (262, FIG. 9; 310, FIG. 11). In the high frequency stages the first smoothing circuit time constant is about 8 ms; in the low frequency stages, about 15 ms.

The pass-band portion (254, FIG. 9) of the control circuit is derived directly from the fixed band element 106 (FIG. 9) output via a buffer amplifier (not shown) and via 1.6 kHz high pass filter 143 in the high frequency stages. In the low frequency stages, the pass-band portion (312, FIG. 11) of the control circuit is derived from the output of filter 164 (FIG. 1) through the 400 Hz low pass filter 192 (FIG. 11). The pass-band portion of the control circuit also has a full wave rectifier (266, FIG. 9; 316, FIG. 11) configured in the same way as the full wave rectifier in the circuit of FIG. 12. The full wave rectifier includes operational amplifier 484, input resistor 482, diodes 486, 488, feedback resistor 490, and summing resistors 492 and 494. The summing resistors operate in cooperation with operational amplifier 496 that functions not only as a summing amplifier but also as the first smoothing circuit (268, FIG. 9; 318, FIG. 11). The input is applied to the inverting input of amplifier 496 and its non-inverting input is connected to minus 9 volts. Capacitor 498 and resistor 472 are connected in parallel in the feedback path of amplifier 468. In the high frequency stages the first smoothing circuit time constant is about 8 ms; in the low frequency stages, about 15 ms. Resistor 502 couples the output of the pass-band first smoothing circuit stage to the maximum selector.

The maximum selector output is applied to the second smoothing circuit stage (270, FIG. 9; 320, FIG. 11). The second smoothing circuit includes the main smoothing resistor 504 and the smoothing capacitor 514 having a time constant of about 160 ms in the high frequency stages and about 300 ms in the low frequency stages. A low valued resistor 512 is located in series with the second smoothing circuit capacitor.

The second smoothing circuit capacitor 514 also receives at least one other charging input: one input (in the high frequency stages) and three inputs (in the low frequency stages). In the high frequency stages the input is from the primary overshoot suppression circuit (FIG. 14) forming part of that high frequency fixed band circuit through diode 280 (FIG. 9). In the low frequency stages, the inputs are from the primary overshoot suppression circuit (FIG. 14) forming part of that high, frequency fixed band circuit through diode 385 (FIG. 11), the secondary overshoot circuit (FIG. 16) also forming part of that high frequency fixed band circuit through diode 376 (FIG. 11), and the low frequency overshoot circuit (FIG. 17) also forming part of that high frequency fixed band circuit through diode 396 (FIG. 11). Resistor 512 buffers the output of the overshoot suppression circuits to prevent the operational amplifier in those circuits from going into high frequency oscillation. All of the charging inputs, the steady-state input from the first smoothing circuit and the one or more inputs from the overshoot suppression circuits contribute to the charging of the second smoothing circuit capacitor, from which the control signal is derived.

A DC control amplifier (FET driver) 516 (122, FIG. 9; 170, FIG. 11) drives the fixed band FET (variable resistor 112, FIG. 9; variable resistor 156, FIG. 11) in accordance with the voltage on the second smoothing circuit capacitor 514.

FIG. 14 shows the primary overshoot suppression side circuit used in both the sliding band and fixed band portions of the high frequency and low frequency stages. Some aspects of the circuit are described above in connection with the descriptions of FIGS. 9 and 11. A summing node 549 (282 in sliding band portion of the high frequency stage of FIG. 9; 278 in the fixed band portion; 364 in the sliding band portion of the low frequency stage of FIG. 11; 356 in the fixed band portion) at the inverting input of operational amplifier 550 has a plurality of summing resistors connected to it. Summing resistors 546 and 548 are from a full-wave rectifier (in the high frequency sliding band circuit, from full-wave rectifier 138 in the main control circuit [FIG. 9]; in the high frequency fixed band circuit, from full-wave rectifier 256 in the main control circuit [FIG. 9]; in the low frequency sliding band circuit, from full-wave rectifier 362 in the overshoot suppression circuit side path [FIG. 11]; in the low frequency fixed band circuit, from full-wave rectifier 354 in the overshoot suppression circuit side path [FIG. 11]). Summing resistor 552 is representative of one or more separate summing resistors from one or more modulation control signal inputs. In the high frequency sliding band circuit, the input is MC2; in the high frequency fixed band circuit the input is MC3. In the low frequency sliding band circuit the inputs are MC5, MC7, and MC8; in the low frequency fixed band circuit the inputs are MC7 and MC8.

Operational amplifier 550 functions as a summing amplifier and also to set the appropriate AC and DC conditions for its overshoot suppression output signal which is coupled to the second smoothing stage of the various sliding band and fixed band circuits via coupling diode 568 (284 in the sliding band circuit of the high frequency stage, FIG. 9; 280 in the fixed band circuit, FIG. 9; 366 in the sliding band circuit of the low frequency stage (FIG. 11); 346 in the fixed band circuit). As explained further below, coupling diode 568 is used as a variable resistor to provide a voltage dependent charging current by adjusting the operating parameters so that it operates in the knee of its forward-biased operating characteristic. The gain of the side circuit of FIG. 14 is slightly less than the gain of the steady-state circuit with which it is associated. This difference in relative gains is essential to the overall operation, as explained further below. Diode 554 provides temperature compensation for diode 568. Resistor 560 biases diode 554 into conduction. Resistor 558 is the feedback resistor for the operational amplifier. Resistor 562 is adjusted to bias the amplifier so as to provide the optimum DC voltage relative to that of the steady-state circuit. Diode 556 prevents the output from swinging to the negative supply rail: under certain input conditions, if the modulation control signal applied to the overshoot suppression circuit is opposing the signal from the full-wave rectifier very much, the signal in the amplifier 550 could otherwise be forced out of its linear operating region down to the negative supply rail, thus slowing down the amplifier. Diode 566 and resistor 564 function to decrease the aggressiveness of the overshoot suppression action at high input levels: the size of the overshoot suppression signal is limited at high input signal levels.

FIG. 15 shows in block diagram form an alternative form of the circuit of FIG. 14. In this alternative, the operational amplifier 550 of FIG. 14 is operated as a variable gain amplifier, controlled by the modulation control signal input such that as the modulation control signal increases, the gain of the amplifier decreases. The limiter 572 can be provided by an arrangement such as diode 566 and resistor 564 in the circuit of FIG. 14. Optionally, the modulation control signal may also be applied in a smaller proportion than in the circuit of FIG. 14 so as to buck (oppose) the input or output of the variable gain amplifier before or after limiter 572, in summing circuit 574. A further operational amplifier can be employed as a summing amplifier. The output of the summing circuit is then applied to a coupling diode 576. Although the alternative arrangement of FIG. 15 requires additional circuit components, it would allow more exact control of the overshoot suppression circuit and better tracking with the steady-state portion of the control circuit.

FIG. 16 shows the secondary overshoot suppression side circuit in the fixed band circuit of the low frequency stage. Some aspects of the circuit are explained above in connection with the description of FIG. 11. Its output is used in both the fixed band and sliding band portions of the low frequency stage. A summing node 372 at the inverting input of operational amplifier 588 has three summing resistors connected to it. Summing resistors 580 and 582 are from full-wave rectifier 304 in the low frequency fixed band circuit (FIG. 11). Operational amplifier 588 functions as a summing amplifier and also as a limiter. Resistor 590 is a feedback resistor. Diode 594 and resistor 592 provide the same function as diode 566 and resistor 564 in the circuit of FIG. 14. In addition, diode 594 functions to provide temperature compensation for the coupling diodes (598 and 604). Resistor 596 biases the diode 594 into conduction during signal transients, providing limiting. During this time the diode is also providing temperature compensation. The output to the capacitor of the low frequency fixed band second smoothing circuit is taken through diode 598. The output to the low frequency sliding band capacitor is taken through diode 604 via a biasing network made up of resistors 600 and 602.

FIG. 17 shows the details of the low frequency overshoot side circuit, some aspects of which are described above in connection with the description of FIG. 11. The inputs at summation point 382 at the input of operational amplifier 620 are taken: from the full-wave rectifier 316 (FIG. 11) in the pass-band portion of the low frequency fixed band control circuit via feed resistors 610 and 612; from MC6 (applied so as to buck the other signals) via resistor 614; and from the second smoothing circuit 320 (FIG. 11) in the low frequency fixed band control circuit. The latter input is via an operational amplifier 615 and summing resistor 616. The feed from the second smoothing circuit is applied to the non-inverting input, the output is fed back directly to the inverting input and the feed is taken from that point—this negative feedback arrangement causes the feed to buck the input signals from the full-wave rectifier 316 (FIG. 11), thus phasing out the low frequency overshoot action when the fixed band control signal has risen to a sufficient level. There is no need to continue the slow charging effect provided by the low frequency overshoot circuit after the voltage on the smoothing capacitor has risen far enough.

The low frequency overshoot suppressor circuit operates only at low frequencies because MC6, which has a high pass characteristic, is fed in, in opposition to the signal from the full-wave rectifier. The bucking MC6 signal nullifies effects at high frequencies by cancelling out high frequency components in the signal received from the full-wave rectifier. Resistor 618 connected between point 382 and the negative nine volt supply biases the operational amplifier 620.

The operational amplifier 620 has a relatively high value of feedback resistor 622 causing the amplifier gain to be sufficient so that its output reaches the supply rail, thus providing limiting (limiter 384 of FIG. 11). Diode 624, resistor 626, and capacitor 628 constitute the peak rectifier 386, 388 (FIG. 11), giving high amplitude decaying pulses. Capacitor 630 and resistor 632 constitute the differentiator 390 (FIG. 11). The feed to the low frequency fixed band circuit is taken through resistor 634 and diode 636. The feed to the low frequency sliding band circuit is taken through resistor 638 and diode 640.

The low frequency overshoot circuit operates as a type of early warning circuit to sense the buildup of signals. Reliance on the primary overshoot suppression circuit alone would result in no overshoot suppression action until the threshold of the primary overshoot suppression circuit is reached. The low frequency overshoot suppression circuit highly amplifies to generate a vigorous pulse which is peak rectified and held and fed through a high value resistor to gently charge the capacitor from which the control circuit is derived. In operation, the circuit is useful in smoothing the abrupt increases in the control signal caused by the primary overshoot suppression circuit.

FIGS. 18 through 25 are examples of waveforms that are useful in describing the operation of the overshoot suppression circuits. In FIGS. 18 through 22, the horizontal axis is time and the vertical axis is voltage. Assume that the input signal to a stage (for example, the high frequency high level stage) is as shown in FIG. 18, namely a sine wave signal (at 1 kHz, for example) that rises slowly from zero (the increase is slow enough that the steady-state portions of the fixed band and sliding band control circuits can follow the signal) up to a level of about −25 dB (relative to the reference level which is about 20 dB below the maximum level in the system). The threshold (the onset of dynamic action, compression in this example) of the stage is assumed to be −30 dB. After a sufficient period of time for the circuit to reach equilibrium (the output signal amplitude stabilizes at some level), the input signal amplitude is suddenly increased to −10 dB and kept at that level long enough for the circuit to reach equlibrium once again.

FIG. 19 depicts an example of how the fixed band or the sliding band control voltage of the stage reacts to the input signal, with and without the primary overshoot circuit. FIG. 20 shows an example of the output of the primary overshoot circuit associated with the fixed band or the sliding band portion of the stage in response to the input signal. FIG. 21 shows an example of the overall stage output without the use of any overshoot suppression circuits and FIG. 22 shows an example of the overall stage output with the use of overshoot suppression circuits.

As the input signal rises from zero to −25 dB, the control signal voltage rises smoothly to a stable value in response to the −25 dB input level. At the same time the output of the overshoot suppression circuit (an amplitude scaled full-wave rectified version of the input signal) rises. However, because the steady-state portion of the control circuit is able to follow the input signal, the amplitude of the overshoot suppression circuit is less that the output of the steady-state portion of the control circuit (it has less gain) and thus the overshoot suppression circuit does not contribute to the charging of the second smoothing circuit capacitor and to the control signal voltage under these circumstances. In FIGS. 21 and 22, which are the same during this period, the output signal slowly rises, but to a lower level than the input signal because of the compression action of the stage.

When the input signal jumps to −10 dB the overshoot suppression circuit output also jumps immediately in amplitude because there is essentially no time delay in its circuit. The only significant delay is caused by the slew rate of the operational amplifier and the ability of the second integrating capacitor to charge instantaneously, resulting in about a 10 microsecond delay which results in an overshoot of about that time length—so short as to be essentially ultrasonic. Because of the time constants of the first and second smoothing circuits, the steady-state portion of the control circuit is unable to follow immediately the jump in the input signal amplitude. Thus, the charging output of the overshoot suppression circuit is greater than the charging output of the steady-state portion of the control circuit and the overshoot suppression circuit is responsible for charging the second smoothing circuit capacitor until enough time elapses for the steady-state portion of the control circuit to catch up. FIG. 19 shows how the control voltage is "bumped up" by the overshoot suppression circuit charging current shown in FIG. 20. The portion of FIG. 20 labeled "w/o O/S" (without overshoot) indicates the manner in which the control voltage would slowly increase in response only to the steady-state portion of the control circuit, without any assistance from the overshoot suppression side circuit.

FIG. 21 shows how the output signal would rise to a very high level and then slowly decay to the steady-state condition as the control signal without overshoot suppression slowly rises to its equilibrium level, whereas FIG. 22 shows the output signal rising only briefly to a value only slightly higher than its equilibrium level as the overshoot suppression circuit causes a quick, but controlled, increase in the control voltage.

FIG. 23 shows in greater detail an example of the interrelationship between the overshoot suppression charging current and the control voltage as a the input level is suddenly increased from −25 dB to −10 dB. The Figure is an expanded view showing only the first tens of milliseconds or so. FIG. 24 is similar to FIG. 23 but shows the overshoot suppression charging current and the control voltage over a much longer period of time, hundreds of milliseconds or so. The envelope of the overshoot suppression circuit pulses decays to a steady-state level as the stage output reaches equilibrium while at the same time the control voltage derived from the capacitor voltage slowly increases in response to charging by the steady-state portion of the control circuit. The overshoot suppression circuit acts only briefly to rapidly increase the capacitor voltage to a level close to, but less than, its ultimate steady-state value.

It will be noted that the effect of the overshoot suppression circuit in these examples is to cause some interruption in the smoothness of the control voltage. The extent to which the control voltage smoothness is affected depends on the severity of the change in the input signal. An important feature of the overshoot suppression circuit is that its output is related to the rate of change of the input signal. This is accomplished by operating the coupling diode 568 (FIG. 14) so that the diode is forward biased into the knee of its operating curve as shown in FIG. 25. The charging current thus increases as the input voltage increases. Diode 566 and resistor 564 (FIG. 14) assist in assuring that the circuit does not provide more charging current than required by reducing the amplifier gain for higher level signals.

A basic feature of the interraction between the steady-state portion of the control circuit and the overshoot suppression portion is that the combined arrangement acts abruptly when it has to and as soon as it can it lets loose of the fast action and moves into a slow acting regime. Consequently, most of the time the overshoot suppression circuit is not acting at all. Most of the time the signal is controlled by well smoothed control signals.

The secondary overshoot circuit (FIG. 17) operates in essentially the same way as the primary overshoot circuit. The secondary overshoot suppression circuit is required whenever a smoothed modulation control signal is used to provide the threshold tracking effect in the primary overshoot suppression circuit because the smoothing filter destroys the ability of the circuit to discriminate frequencies.

I claim:

1. A circuit for modifying the dynamic range of an input signal comprising
   means for modifying the dynamic range of said input signal in response to a control signal to provide an output signal, and
   means for generating said control signal, said control signal generating means including
      capacitance means for smoothing the control signal,
      means for deriving a first signal from a signal point substantially the same dynamically as said output signal,
         the rate of change of amplitude with time of said first signal being less than the rate of change of amplitude with time of said output signal,
      means for charging said capacitance means with said first signal in response to steady-state conditions,
      means for deriving a second signal from a point substantially the same dynamically as said output signal,
         the rate of change of amplitude with time of said second signal being substantially similar to that of said output signal,
      means for charging said capacitance means very rapidly with said second signal in response to transient input signal conditions, and
      means for deriving said control signal from the charge on said capacitance means.

2. The circuit of claim 1 wherein said means for charging the capacitance means with a first signal is in a first signal path and said means for charging the capacitance means with a second signal is in a second signal path.

3. The circuit of claim 1 wherein said means for charging said capacitance means with a second signal includes means for limiting the charging of said capacitance means by said second signal, whereby overshoot suppression effects are limited.

4. The circuit of claim 1 wherein said means for charging said capacitance means with a first signal has a first signal responsive variable threshold and said means for charging said capacitance means with a second signal has a second signal responsive variable threshold, higher than said first threshold, said first and second thresholds rising and falling in substantially the same way.

5. The circuit of claim 4 wherein the lowest point of said second threshold relative to said first threshold is about 10 decibels above said first threshold for extreme transient conditions.

6. The circuit of claim 1 wherein said means for charging said capacitance means very rapidly with a second signal has a charging rate which increases as the amplitude of the input signal increases, whereby overshoot suppression effects are controllably phased in.

7. The circuit of claim 1 wherein said means for charging said capacitance means with a second signal has an overall circuit gain which is less than the overall circuit gain of said means for charging said capacitance means with a first signal.

8. The circuit of claims 1, 3, 4, 6, or 7 wherein said means for charging the capacitance means with a second signal charges said capacitance means to a level substantially no greater than the level to which the means for charging the capacitance means with a first signal later charges the capacitance means in response to the same portion of the output signal.

9. The circuit of claim 8 wherein said means for generating said control signal further comprises means for charging said capacitance means with a third signal, said means for charging said capacitance means with a third signal charging said capacitance means slowly in response to low frequency increases in the amplitude of said input signal.

10. The circuit of claim 9 wherein said means for charging said capacitance means with said third signal includes
   means for amplifying, peak rectifying, and smoothing a signal applied to the input of said means for charging said capacitance means with said third signal, and means for gently charging said capacitance means with said amplified, peak rectified, and smoothed signal.

11. The circuit of claim 9 wherein said means for charging said capacitance means with said third signal derives its input signal from said signal point in opposition to said control signal thereby providing a negative feedback arrangement that reduces the charging signal as the control signal increases.

12. The circuit of claims 1, 3, 4, 6, or 7 wherein said first signal has a charging effect larger than the charging effect of said second signal for slowly changing input signals and the second signal has a charging effect larger than the charging effect of said first signal means for rapidly changing input signals.

13. The circuit of claim 12 wherein said means for generating said control signal further comprises means for charging said capacitance means with a third signal, said means for charging said capacitance means with a third signal charging said capacitance means slowly in response to low frequency increases in the amplitude of said input signal.

14. The circuit of claim 13 wherein said means for charging said capacitance means with said third signal includes
   means for amplifying, peak rectifying, and smoothing a signal applied to the input of said means for charging said capacitance means with said third signal, and
   means for gently charging said capacitance means with said amplified, peak rectified, and smoothed signal.

15. The circuit of claim 13 wherein said means for charging said capacitance means with said third signal derives its input signal from said signal point in opposition to said control signal thereby providing a negative feedback arrangement that reduces the charging signal as the control signal increases.

16. The circuit of claims 1, 3, 4, 6, or 7 wherein said means for generating a control signal further comprises means for charging said capacitance means with a third signal, said means for charging said capacitance means with a third signal charging the capacitance means slowly in response to low frequency increases in the amplitude of said input signal.

17. The circuit of claim 16 wherein said means for charging said capacitance means with said third signal includes
means for amplifying, peak rectifying, and smoothing a signal applied to the input of said means for charging said capacitance means with said third signal, and
means for gently charging said capacitance means with said amplified, peak rectified, and smoothed signal.

18. The circuit of claim 17 wherein said means for gently charging said capacitance means with the smoothed signal comprises differentiating means, high value resistance means and diode means.

19. The circuit of claim 16 wherein said means for charging said capacitance means with said third signal derives its input signal from said signal point in opposition to said control signal thereby providing a negative feedback arrangement that reduces the charging signal as the control signal increases.

20. The circuit of claims 1, 3, 4, 6, or 7 wherein said means for charging said capacitance means with a second signal includes diode means, said means for charging said capacitance means with a second signal operating said diode means in that portion of its diode characteristic such that said diode means operates as a variable resistor in order to provide a voltage dependent charging current.

21. A circuit for modifying the dynamic range of an input signal, comprising
means for modifying the dynamic range of said input signal in response to a control signal to provide an output signal, and
means for generating said control signal, said control signal generating means including
means for deriving a first signal from a signal point substantially the same dynamically as said output signal,
means for rectifying said first signal,
means, including capacitance means, for smoothing said rectified first signal, said capacitance means being charged by said rectified first signal,
means for deriving a second signal from a signal point substantially the same dynamically as said output signal,
means for rectifying said second signal,
means, having a variable low impedance, for applying a charging current to said capacitance means, the amplitude of said charging current
being determined by the amplitude of said rectified second signal, and
increasing as the amplitude of said rectified second signal increases,
whereby overshoot suppression effects are controllably phased in, and
means for deriving said control signal from the charge on said capacitance means.

22. The circuit of claim 21 wherein said means for deriving said first signal, said means for rectifying said first signal, and said means for smoothing said rectified first signal comprise a steady-state signal path and wherein said means for deriving said second signal, said means for rectifying said second signal, and said means for applying a charging current to said capacitance means comprise an overshoot suppression signal path.

23. The circuit of claim 22 wherein said overshoot suppression signal path has a time constant for charging said capacitance means substantially shorter than the time constant of the steady-state signal path for charging said capacitance means, whereby transient input signal components are rapidly applied to said capacitance means via said overshoot suppression signal path.

24. The circuit of claim 21 wherein the gain of said overshoot suppression signal path is less than the gain of the steady-state signal path, whereby the overshoot suppression signal path charges said capacitance means to a level substantially no greater that the level to which the steady-state signal path charges the capacitance means in response to the same portion of the output signal.

25. The circuit of claim 24 wherein said means for applying a charging current to said capacitance means includes diode means, said means for applying a charging current operating said diode means in that portion of its diode characteristic such that said diode means operates as a variable resistor in order to provide a voltage dependent charging current.

26. The circuit of claims 21, 24, or 25 further comprising
means for deriving a third signal from a signal point substantially the same dynamically as said output signal, said third signal responding to low frequency increases in the amplitude of said input signal and,
means for charging the capacitance means slowly with said third signal.

27. The circuit of claim 26 wherein said means for charging said capacitance means with said third signal has a charging rate which increases as the amplitude of the third signal increases.

28. The circuit of claim 26 wherein said means for charging said capacitance means with said third signal includes
means for amplifying, peak rectifying, and smoothing a signal applied to the input of said means for charging said capacitance means with said third signal, and
means for gently charging said capacitance means with said amplified, peak rectified, and smoothed signal.

29. The circuit of claim 28 wherein said means for gently charging said capacitance means with the smoothed signal comprises differentiating means, high value resistance means and diode means.

30. The circuit of claim 13 wherein said means for charging said capacitance means with said third signal derives its input signal from said signal point in opposition to said control signal thereby providing a negative feedback arrangement that reduces the charging signal as the control signal increases.

31. The circuit of claim 21 wherein said means for smoothing said rectified first signal includes a first smoothing stage and a second smoothing stage, said second smoothing stage including said capacitance means and said first smoothing stage including further capacitance means, said first smoothing stage having a shorter attach time constant than said second smoothing stage, said first smoothing stage and second smoothing stage being interconnected.

32. The circuit of claim 21 wherein said means for applying a charging current to said capacitance means, said charging current being dependent on the amplitude of said second signal, includes means for limiting the charging of said capacitance means by said charging current, whereby overshoot suppression effects are limited.

33. The circuit of claim 21 wherein said means for charging said capacitance means with said rectified first signal has a first signal responsive variable threshold and said means for applying a charging current to said capacitance means, said charging current being dependent on the amplitude of said second signal, has a second signal responsive variable threshold, higher than said first threshold, said first and second thresholds rising and falling in substantially the same way.

34. The circuit of claim 33 wherein the lowest point of said second threshold relative to said first threshold is about 10 decibels above said first threshold for extreme transient conditions.

35. The circuit of claim 21 wherein said means for applying a charging current to said capacitance means includes diode means, said means for applying a charging current operating said diode means in that portion of its diode characteristic such that said diode means operates as a variable resistor in order to provide a voltage dependent charging current.

36. A circuit for modifying the dynamic range of an input signal, comprising
frequency selective circuit means for dividing the frequency spectrum in which the input signal lies into pass-band and stop-band regions,
means for modifying the dynamic range of signal components in the pass-band region in response to a control signal to provide an output signal, said control signal acting in response to signal components lying in the pass-band and stop-band regions,
means for deriving at least one modulation control signal from a signal point substantially the same dynamically as said output signal, said modulation control signal having the characteristic that when combined in opposition with said control signal, the control signal is altered, in a level dependent way, so as to make the control signal less responsive to stop-band signal components as the level of the input signal rises, and
means for generating said control signal, said control signal generating means including
capacitance means,
means for deriving a first signal by combining said modulation control signal in opposition with a signal derived from a signal point substantially the same dynamically as said output signal,
means for charging said capacitance means with said first signal in response to steady-state input signal conditions,
means for deriving a second signal by combining said modulation control signal in opposition with a signal derived from a signal point substantially the same dynamically as said output signal,
means for charging said capacitance means very rapidly with said second signal in response to transient input signal conditions, and
means for deriving said control signal from the charge on said capacitance means.

37. The circuit of claim 36 wherein the first and second signals are derived in opposition to the same modulation control signal.

38. The circuit of claim 36 wherein the modulation control signal used in deriving said first signal is connected to the input of a smoothing means, and the modulation control signal used in deriving said second signal is derived from the output of said smoothing means.

39. The circuit of claim 36 wherein said means for charging said capacitance means with a first signal includes a first smoothing stage and a second smoothing stage, said second smoothing stage including said capacitance means and said first smoothing stage including further capacitance means, said first smoothing stage having a shorter attach time constant than said second smoothing stage.

40. A plurality of circuits in accordance with claim 36, arranged in series, wherein said at least one modulation control signal for use in all of said circuits is derived from a signal point substantially the same dynamically as the output of only one of the series circuits.

41. The circuit of claim 36 wherein the gain of said means for charging said capacitance means with a second signal is less than the gain of said means for charging said capacitance with a first signal, whereby the second signal charges said capacitance means to a level substantially no greater than the level to which the first signal charges the capacitance means in response to the same portion of the input signal.

42. The circuit of claim 41 wherein said means for charging said capacitance means very rapidly with a second signal has a charging rate which increases as the amplitude of the input signal increases, whereby overshoot suppression effects are controllably phased in.

43. The circuit of claim 15 wherein said means for charging said capacitance means with a first signal derives said first signal by passing said signal derived from a point substantially the same dynamically as said output signal through a variable gain amplifier, the gain of said amplifier
being controlled by said modulation control signal, and
decreasing as the amplitude of said modulation control signal increases.

44. The circuit of claim 36 wherein said means for charging said capacitance means with a second signal derives said second signal by passing said signal derived from a point substantially the same dynamically as said output signal through a variable gain amplifier, the gain of said amplifier
being controlled by said modulation control signal, and
decreasing as the amplitude of said modulation control signal increases.

45. The circuit of claim 36 wherein said means for charging said capacitance means with a second signal includes means for limiting the charging of said capacitance means by said second signal, whereby overshoot suppression effects are limited.

46. The circuit of claim 36 wherein said means for charging said capacitance means with a first signal has a first signal responsive variable threshold and said means for charging said capacitance means with a second signal has a second signal responsive variable threshold, higher than said first threshold, said first and second thresholds rising and falling in substantially the same way.

47. The circuit of claim 46 wherein the lowest point of said second threshold relative to said first threshold is about 10 decibels above said first threshold for extreme transient conditions.

48. The circuit of claim 36 wherein said means for charging said capacitance means very rapidly with a second signal has a charging rate which increases as the amplitude of the input signal increases, whereby overshoot suppression effects are controllably phased in.

49. The circuit of claim 48 wherein said means for charging said capacitance means very rapidly with a second signal includes diode means, said means charging said capacitance means very rapidly with a second signal operating said diode means in that portion of its diode characteristic such that said diode means operates as a variable resistor in order to provide a voltage dependent charging current.

50. The circuit of claims 48 or 49 wherein said means for charging said capacitance means with a second signal includes means for limiting the charging of said capacitance means by said second signal, whereby overshoot suppression effects are limited.

51. The circuit of claims 36, 41, 45, 46, or 48 further comprising
    means for deriving a third signal by combining a signal derived from a signal point substantially the same dynamically as said output signal in opposition with a modulation control signal, and
    means for charging said capacitance means with said third signal in response to low frequency increases in the amplitude of said input signal.

52. The circuit of claim 51 wherein the modulation control signal used to derive said third signal cancels out high-frequency components in said third signal.

53. The circuit of claim 51 wherein said means for charging said capacitance means with said third signal includes
    means for amplifying, peak rectifying, and smoothing a signal applied to the input of said means for charging said capacitance means with said third signal, and
    means for gently charging said capacitance means with said amplified, peak rectified, and smoothed signal.

54. The circuit of claim 53 wherein said means for gently charging said capacitance means with the smoothed signal comprises differentiating means, high value resistance means and diode means.

55. The circuit of claim 51 wherein said means for charging said capacitance means with said third signal derives its input signal from said signal point in opposition to said control signal thereby providing a negative feedback arrangement that reduces the charging signal as the control signal increases.

56. A circuit according to claims 36 and 48 wherein the circuit is a dual-path circuit comprising a main path and a further path,
    said main path
        being linear with respect to dynamic range, and
        consisting at least of a combining circuit, and
    said further path
        consisting at least of said means for modifying the dynamic range of said signal components in the pass band region and said means for generating said control signal,
    having its input coupled
        in a Type I circuit to the input of said main path, or
        in a Type II circuit to the output of said main path,
    having its output coupled to said combining circuit, and
    providing a signal, said signal
        boosting or bucking the main path signal by way of the combining circuit, at least in a part of the frequency band, and
        being so limited that, in the upper part of the input dynamic range, its boosting or bucking effect on the main path signal is negligibly small.

57. A circuit for modifying the dynamic range of an input signal, comprising
    first dynamic action means having a fixed band characteristic action acting in response to a first control signal to provide a first output signal, said first dynamic action means including means for generating a first control signal, said means for generating a first control signal including
        capacitance means,
        means for deriving a first signal from a signal point substantially the same dynamically as said first output signal,
        means for charging said capacitance means with said first signal in response to steady-state input signal conditions,
        means for deriving a second signal from a signal point substantially the same dynamically as said first output signal,
        means for charging said capacitance means very rapidly with said second signal in response to transient input signal conditions, and
        means for deriving said first control signal from the charge on said capacitance means,
    second dynamic action means having a sliding band characteristic action in response to a second control signal to provide a second output signal, said second dynamic action means including means for generating a second control signal, said means for generating a second control signal including
        further capacitance means,
        means for deriving a third signal from a signal point substantially the same dynamically as said second output signal,
        means for charging said further capacitance means with said third signal in response to steady-state input signal conditions,
        means for deriving a fourth signal from a signal point substantially the same dynamically as said second output signal,
        means for charging said further capacitance means very rapidly with said fourth signal in response to transient input signal conditions, and
        means for deriving said second control signal from the charge on said further capacitance means, and
    means for coupling said first dynamic action means to said second dynamic action means.

58. The circuit of claim 57 wherein said means for generating a first control signal further comprises means for deriving a fifth signal from a signal point substantially the same dynamically as said first output signal, and means for charging said capacitance means slowly with said firth signal in response to low frequency increases in the amplitude of said first output signal.

59. The circuit of claim 58 wherein said means for generating a second control signal further comprises means for charging said further capacitance means with said fifth signal.

60. The circuit of claim 58 wherein said means for charging said capacitance means with said fifth signal includes means for amplifying, peak rectifying, and smoothing a signal applied to the input of said means for charging said capacitance means with said fifth signal, and means for gently charging said capacitance means with said amplified, peak rectified, and smoothed signal.

61. The circuit of claim 60 wherein said means for gently charging said capacitance means with the smoothed signal comprises differentiating means, high value resistance means and diode means.

62. The circuit of claim 58 wherein said means for charging said capacitance means with said fifth signal derives its input signal from said signal point in opposition to said control signal thereby providing a negative feedback arrangement that reduces the charging signal as the control signal increases.

63. The circuit of claims 57 or 58 wherein said means for generating a second control signal further comprises means for charging said further capacitance means with said second signal.

64. The circuit of claim 57 wherein said means for charging said capacitance means very rapidly with a second signal has a charging rate which increases as the amplitude of the input signal increases, whereby overshoot suppression effects in said first dynamic action means are controllably phased in, and wherein said means for charging said further capacitance means very rapidly with a fourth signal has a charging rate which increases as the amplitude of the input signal increases, whereby overshoot suppression effects in said second dynamic action means are controllably phased in.

65. The circuit of claim 64 wherein said means for charging said capacitance means very rapidly with a second signal includes diode means, said means charging said capacitance means very rapidly with a second signal operating said diode means in that portion of its diode characteristic such that said diode means operates as a variable resistor in order to provide a voltage dependent charging current and wherein said means for charging said further capacitance means very rapidly with a fourth signal includes further diode means, said means charging said capacitance means very rapidly with a fourth signal operating said further diode means in that portion of its diode characteristic such that said further diode means operates as a variable resistor in order to provide a voltage dependent charging current.

66. The circuit of claims 57 or 64 wherein said means for charging said capacitance means with a second signal includes means for limiting the charging of said capacitance means by said second signal, whereby overshoot suppression effects in said first dynamic action means limited, and wherein said means for charging said further capacitance means with a fourth signal includes means for limiting the charging of said further capacitance means by said fourth signal, whereby overshoot suppression effects in said second dynamic action means are limited.

67. A circuit according to claims 57, 58 and 64 wherein the circuit is a dual-path circuit comprising a main path and a further path, said main path
being linear with respect to dynamic range, and consisting at least of a combining circuit, and said further path
consisting at least of said first dynamic action means, said second dynamic action means and said means for generating said first and second control signals, having its input coupled
in a Type I circuit to the input of said main path, or in a Type II circuit to the output of said main path, having its output coupled to said combining circuit, and providing a signal, said signal
boosting or bucking the main path signal by way of the combining circuit, at least in a part of the frequency band, and being so limited that, in the upper part of the input dynamic range, its boosting or bucking effect on the main path signal is negligibly small.

68. A circuit for modifying the dynamic range of an input signal, comprising means for modifying the dynamic range of said input signal in response to a control signal to provide an output signal, and means for generating said control signal, said control signal generating means including capacitance means from which said control signal is derived, and said means for generating said control signal further comprising means for deriving a charging signal from a signal point substantially the same dynamically as said output signal, and means for charging said capacitance means with said charging signal, said means for charging said capacitance means charging said capacitance means slowly in response to low frequency increases in the amplitude of said output signal.

69. The circuit of claim 68 wherein said means for charging said capacitance means includes means for amplifying, peak rectifying, and smoothing the output of said means for deriving a signal from a signal point substantially the same dynamically as said output signal, and means for gently charging said capacitance means with said amplified, peak rectified, and smoothed signal.

70. The circuit of claim 69 wherein said means for gently charging said capacitance means with the smoothed signal comprises differentiating means, high value resistance means and diode means.

71. The circuit of claims 68 or 69 wherein said means for charging said capacitance means derives its charging signal from said signal point in opposition to said control signal thereby providing a negative feedback arrangement that reduces the charging signal as the control signal increases.

72. A circuit according to claims 1, 8, or 68 wherein the circuit is a dual-path circuit comprising a main path and a further path, said main path being linear with respect to dynamic range, and consisting at least of a combining circuit, said further path consisting at least of said means for modifying the dynamic range of said input signal and said means for generating said control signal having its input coupled in a Type I circuit to the input of said main path, or in a Type II circuit to the output of said main path having its output coupled to said combining circuit, and providing a signal, said signal boosting or bucking the main path signal by way of the combining circuit, at least in a part of the frequency band, and being so limited that, in the upper part of the input dynamic range, its boosting or bucking effect on the main path signal is negligibly small.

* * * * *

UNITED STATES PATENT AND TRADEMARK OFFICE
CERTIFICATE OF CORRECTION

Page 1 of 2

PATENT NO. : 4,922,535
DATED : May 1, 1990
INVENTOR(S) : Ray Milton Dolby

It is certified that error appears in the above-identified patent and that said Letters Patent is hereby corrected as shown below:

Column 02:
 Line 49: add --.-- after "signal"
Column 12:
 Line 14: delete "is" after "is" and before "unnecessary"
Column 17:
 Line 58: insert --suppression-- after "overshoot" and before "effects"
Column 23:
 Line 53: "overshooot" should be --overshoot--
Column 24:
 Line 12: "(FIG. 1)" should be --(FIG. 11)--
Column 27:
 Line 66: "that" should be --than--
Column 28:
 Line 07: insert --,-- after "dB" and before "the"
 Line 43: delete "a" after "as" and before "the"
Column 32:
 Line 22: "that" should be --than--
 Line 60: "claim 13" should be --claim 26--
Column 33:
 Line 04: "attach" should be --attack--

UNITED STATES PATENT AND TRADEMARK OFFICE
CERTIFICATE OF CORRECTION

PATENT NO. : 4,922,535
DATED : May 1, 1990
INVENTOR(S) : Ray Milton Dolby

It is certified that error appears in the above-identified patent and that said Letters Patent is hereby corrected as shown below:

Column 34:
  Line 20: "attach" should be --attack--
  Line 30: after "capacitance" and before "with" add --means--
  Line 40: "claim 15" should be --claim 36--
Column 37:
  Line 05: "firth" should be --fifth--
  Line 66: after "means" and before "limited" insert --are--
Column 39:
  Line 01: "8" should be --21--

Signed and Sealed this

Fifth Day of November, 1991

Attest:

HARRY F. MANBECK, JR.

Attesting Officer

Commissioner of Patents and Trademarks